US010107898B2

(12) United States Patent
Seliuchenko

(10) Patent No.: US 10,107,898 B2
(45) Date of Patent: Oct. 23, 2018

(54) SEMICONDUCTOR PIXEL UNIT FOR SENSING NEAR-INFRARED LIGHT, OPTIONALLY SIMULTANEOUSLY WITH VISIBLE LIGHT, AND A SEMICONDUCTOR SENSOR COMPRISING SAME

(71) Applicant: MELEXIS TECHNOLOGIES NV, Tessenderlo (BE)

(72) Inventor: Volodymyr Seliuchenko, Kyiv (UA)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 50 days.

(21) Appl. No.: 14/956,515

(22) Filed: Dec. 2, 2015

(65) Prior Publication Data

US 2016/0161599 A1    Jun. 9, 2016

(30) Foreign Application Priority Data

Dec. 3, 2014 (GB) .................................. 1421512.3

(51) Int. Cl.
*G01S 7/486* (2006.01)
*H01L 27/146* (2006.01)
(Continued)

(52) U.S. Cl.
CPC ............ *G01S 7/4863* (2013.01); *G01S 7/484* (2013.01); *G01S 17/10* (2013.01);
(Continued)

(58) Field of Classification Search
CPC ...... G01S 7/4863; G01S 7/4914; G01S 7/484; H01L 27/14612; H01L 27/1463;
(Continued)

(56) References Cited

U.S. PATENT DOCUMENTS 5,619,357 A    4/1997   Angelopoulos et al.
8,319,307 B1 * 11/2012  Williams .......... H01L 27/14636
                                                      250/208.1
(Continued)

FOREIGN PATENT DOCUMENTS

EP    0 605 898 A1    7/1994
FR    2 904 432 A1    2/2008
(Continued)

OTHER PUBLICATIONS

Extended European Search Report from Corresponding European Application No. EP 15197555.4, dated Apr. 28, 2016.
(Continued)

*Primary Examiner* — Taeho Jo
(74) *Attorney, Agent, or Firm* — Workman Nydegger

(57) ABSTRACT

A semiconductor pixel unit for sensing near-infrared light, and for optionally simultaneously sensing visible light. The pixel unit comprises a single substrate with a first semiconductor region and a second semiconductor region electrically separated by an insulating region, for example a buried oxide layer. The pixel unit is adapted for generating a lateral electrical field in the second region for facilitating transport of photoelectrons generated in the second region by near-infrared light passing through the first region and the insulating region.

14 Claims, 10 Drawing Sheets

(51) Int. Cl.
*G01S 7/484* (2006.01)
*G01S 17/10* (2006.01)

(52) U.S. Cl.
CPC ...... *H01L 27/1461* (2013.01); *H01L 27/1463* (2013.01); *H01L 27/14645* (2013.01); *H01L 27/14649* (2013.01)

(58) Field of Classification Search
CPC ......... H01L 27/14645; H01L 27/14649; H01L 27/14621; H01L 27/14623; H01L 27/14625; H01L 27/14647; H01L 27/14652; H01L 27/307
USPC ..................................................... 250/338.4
See application file for complete search history.

(56) References Cited

U.S. PATENT DOCUMENTS

| | | | |
|---|---|---|---|
| 8,587,080 B2 | 11/2013 | Gidon et al. | |
| 9,184,194 B2* | 11/2015 | Cellek | H01L 31/1013 |
| 9,379,158 B2 | 6/2016 | Giffard et al. | |
| 2004/0135209 A1* | 7/2004 | Hsieh | G01J 5/02 257/368 |
| 2005/0051730 A1* | 3/2005 | Kuijk | H01L 31/0352 250/370.01 |
| 2005/0104089 A1* | 5/2005 | Engelmann | H04N 5/3651 257/204 |
| 2005/0205930 A1* | 9/2005 | Williams, Jr. | H01L 21/76254 257/347 |
| 2006/0108611 A1* | 5/2006 | Seitz | G01J 9/00 257/222 |
| 2006/0231913 A1* | 10/2006 | Wilsey | G01J 1/4257 257/461 |
| 2006/0249765 A1* | 11/2006 | Hsieh | H01L 27/14609 257/292 |
| 2007/0051876 A1 | 3/2007 | Sumi et al. | |
| 2007/0158638 A1* | 7/2007 | Perera | B82Y 20/00 257/13 |
| 2008/0247033 A1* | 10/2008 | Buettgen | H03D 7/00 359/325 |
| 2008/0290382 A1* | 11/2008 | Hirota | H01L 27/14627 257/291 |
| 2009/0302407 A1 | 12/2009 | Gidon et al. | |
| 2010/0020209 A1 | 1/2010 | Kim | |
| 2010/0102366 A1 | 4/2010 | Lee et al. | |
| 2010/0133441 A1* | 6/2010 | Aurola | H01L 27/14679 250/370.14 |
| 2010/0165134 A1* | 7/2010 | Dowski, Jr. | B24B 13/06 348/218.1 |
| 2011/0019189 A1* | 1/2011 | Crouse | B82Y 20/00 356/365 |
| 2011/0049566 A1* | 3/2011 | Perera | B82Y 20/00 257/185 |
| 2011/0074989 A1 | 3/2011 | Fossum et al. | |
| 2011/0089471 A1* | 4/2011 | Buettgen | H01L 27/14812 257/222 |
| 2011/0175981 A1 | 7/2011 | Lai et al. | |
| 2011/0298079 A1* | 12/2011 | Kawahito | H01L 27/14603 257/443 |
| 2012/0038904 A1 | 2/2012 | Fossum et al. | |
| 2012/0061567 A1* | 3/2012 | Rafferty | H01L 27/14625 250/332 |
| 2012/0104464 A1* | 5/2012 | Janesick | H01L 21/84 257/223 |
| 2012/0147241 A1* | 6/2012 | Yamaguchi | H01L 27/14609 348/311 |
| 2012/0236121 A1 | 9/2012 | Park et al. | |
| 2012/0292521 A1* | 11/2012 | Yokogawa | H01L 27/14625 250/372 |
| 2013/0001651 A1* | 1/2013 | Mase | H01L 27/1463 257/225 |
| 2013/0134299 A1* | 5/2013 | Durini Romero | H01L 27/1461 250/216 |
| 2013/0168792 A1* | 7/2013 | Haddad | H01L 31/02363 257/432 |
| 2013/0176396 A1* | 7/2013 | Cohen | H01L 27/1461 348/46 |
| 2013/0193546 A1* | 8/2013 | Webster | H01L 27/1443 257/438 |
| 2013/0207214 A1* | 8/2013 | Haddad | H01L 31/0236 257/432 |
| 2013/0214161 A1 | 8/2013 | Cazaux et al. | |
| 2013/0234029 A1* | 9/2013 | Bikumandla | H01L 25/043 250/349 |
| 2013/0292788 A1* | 11/2013 | Coimbatore Balram | H01L 31/0352 257/443 |
| 2014/0145281 A1* | 5/2014 | Bever | H01L 31/03527 257/431 |
| 2014/0184810 A1 | 7/2014 | Sekiguchi | |
| 2014/0284663 A1* | 9/2014 | Meinhold | H01L 27/14689 257/225 |
| 2014/0346356 A1 | 11/2014 | Giffard et al. | |
| 2015/0001664 A1* | 1/2015 | Van Der Tempel | H01L 27/14612 257/432 |
| 2015/0243825 A1* | 8/2015 | Keasler | H01L 31/1013 257/184 |
| 2015/0286340 A1* | 10/2015 | Send | G01S 17/46 345/175 |
| 2016/0099429 A1* | 4/2016 | Bruder | H01L 27/307 348/374 |
| 2016/0118428 A1* | 4/2016 | Tsau | H01L 27/14616 250/208.1 |

FOREIGN PATENT DOCUMENTS

| | | |
|---|---|---|
| FR | 2983348 A1 | 5/2013 |
| WO | 2013/104718 A2 | 7/2013 |

OTHER PUBLICATIONS

Fossum, Eric R. et al., "A Review of the Pinned Photodiode for CCD and CMOS Image Sensors," IEEE J. Electron Devices Society, Jan. 2014, 14 pages.

Great Britain Search Report from GB Application No. 1421512.3, dated May 27, 2015.

* cited by examiner

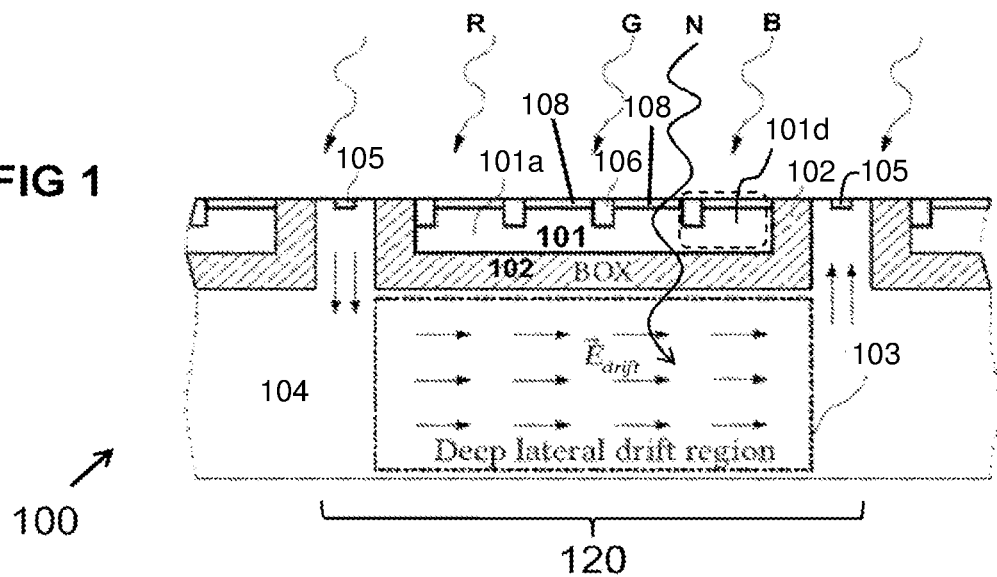
FIG 1
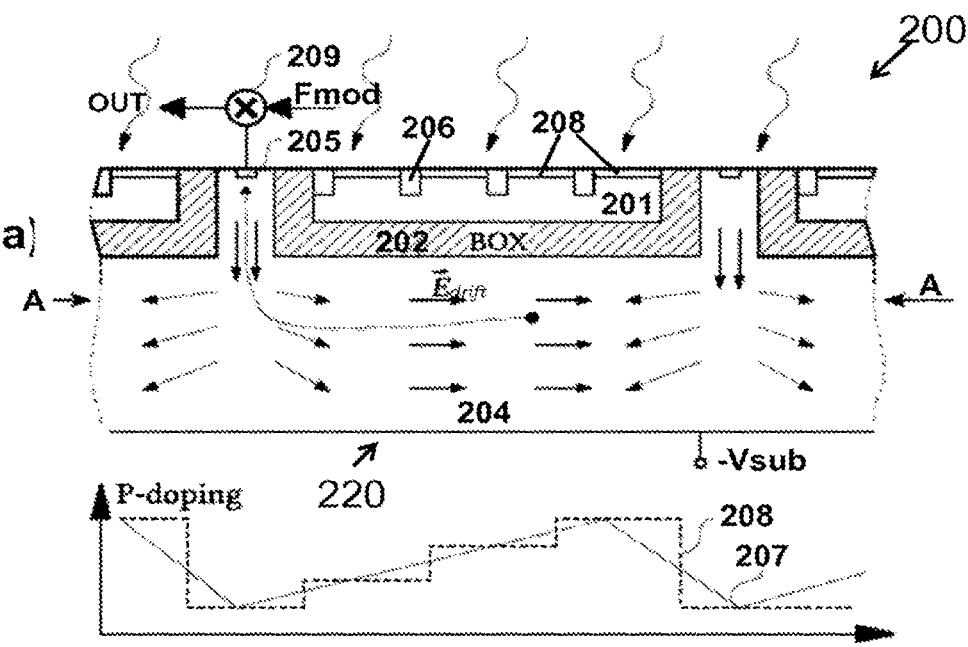
FIG 2(a)
FIG 2(b)

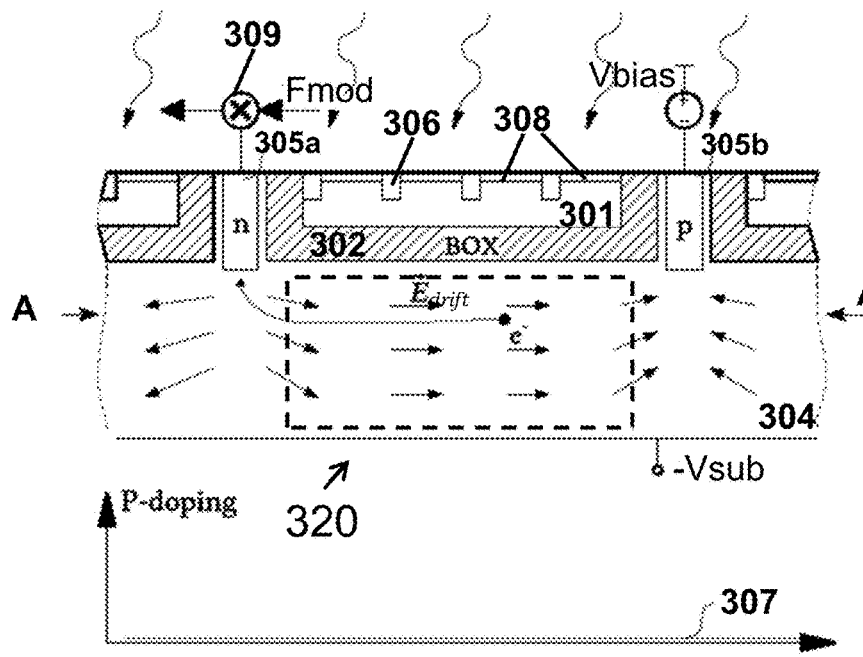
FIG 3
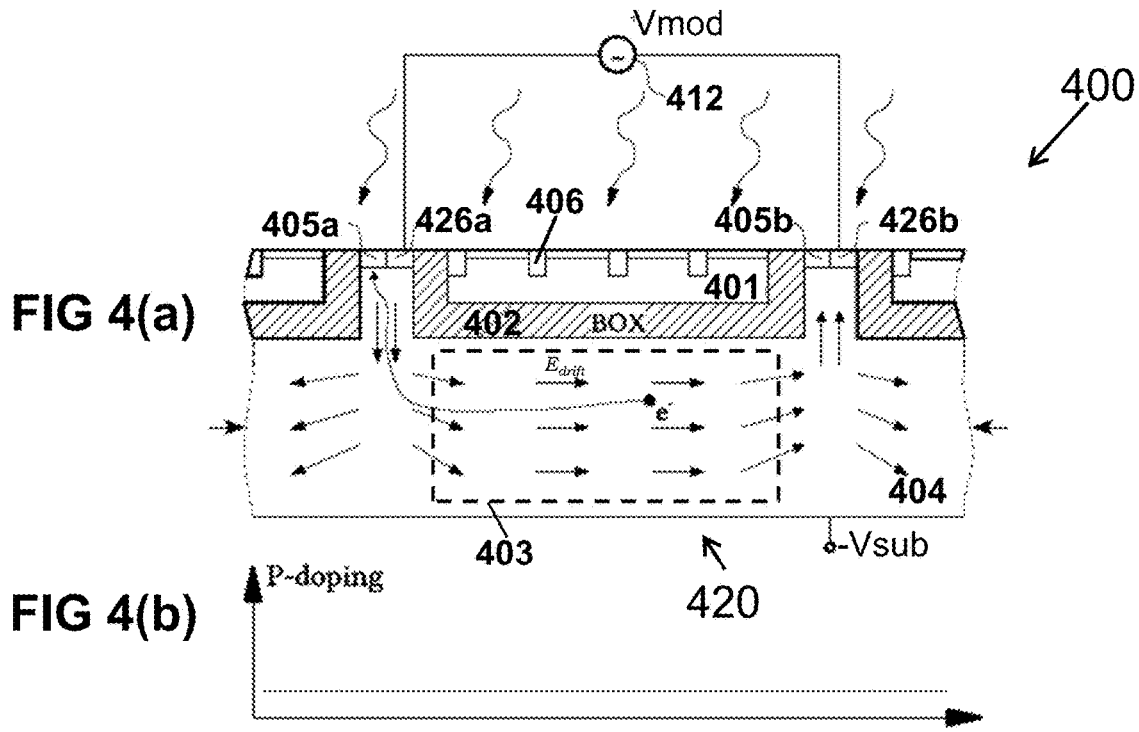
FIG 4(a)
FIG 4(b)

SEMICONDUCTOR PIXEL UNIT FOR SENSING NEAR-INFRARED LIGHT, OPTIONALLY SIMULTANEOUSLY WITH VISIBLE LIGHT, AND A SEMICONDUCTOR SENSOR COMPRISING SAME

FIELD OF THE INVENTION

The invention relates to the field of semiconductor structures for near-infrared (NIR) light and optionally simultaneously sensing visible light. More in particular, the present invention relates to an imaging structure (e.g. a pixel unit) capable of simultaneously capturing visible light information (e.g. grayscale information or color information) and near-infrared light information (e.g. representative of distance information also known as "time-of-flight" (TOF) information).

BACKGROUND OF THE INVENTION

Solid state silicon image sensors became ubiquitous in the recent years. The first high quality image sensors were fabricated in a CCD technology which is nowadays being more and more replaced by CMOS technology. While typical CMOS based image sensor sensitivity is still lower than CCD based sensors, the integration advantages that CMOS technology can provide make it a technology of choice for today's image sensors. Besides the integration, CMOS technology provides building blocks for active pixels which can extend the sensing capabilities of the image sensors beyond just imaging such as e.g. distance measurement, night/fog vision using high speed shutter image sensors, etc.

For machine vision applications, despite increasing resolution, increasing dynamic range of image sensors and increasing computational power of CPUs, it is impossible for a machine to extract distance information from a single 2D-image.

One solution is offered by so called stereo-vision systems. In traditional stereo vision, two cameras, displaced horizontally from one another, are used to obtain two differing views of a same scene, in a manner similar to human binocular vision. By comparing these two images, the relative depth information can be calculated. However, this requires two cameras and a powerful processor.

Another solution is offered by so called "time-of-flight 3D cameras", which provide depth information about the scene. Time-of-flight 3D cameras typically use a near-infrared (NIR) (invisible to humans) modulated or pulsed light source to illuminate the scene, and the reflected near-infrared light is detected by high bandwidth time-of-flight pixels. The time it takes for a light signal to travel from the light source (emitter) to the object and back is proportional to the distance between the emitter and the object. This time delay between the emitted signal and the detected signal, also called "time-of-flight (TOF)" or "round-trip time (RTT)", is usually estimated by frequency domain techniques (e.g. demodulation) or time domain techniques (e.g. correlation). Such "time-of-flight pixels" and corresponding processing circuitry exist, and are known in the art.

Although it is possible to get an image from a (pure) time-of-flight camera, the quality of such an image would be much inferior to the image quality of a typical image sensor as used e.g. in digital cameras. One of the shortcomings is image resolution. Typical time-of-flight pixels are typically much larger than typical image sensor pixels to increase the sensitivity. Another problem is that image sensors and time-of-flight cameras set different requirements towards the optics. A time-of-flight camera typically requires only a narrow band of near-infrared light to reduce the shot noise and early saturation (e.g. due to sunlight), whereas an image sensor requires only visible light.

In order to get both image information (e.g. intensity and/or color information) and distance information, some prior art systems combine an image camera and a 3D-camera, by implementing them as two separate systems. However this requires a high system cost.

US2013/0234029 discloses an image sensor for two-dimensional and three-dimensional image capture, comprising visible light photodetectors embedded in a first substrate, and TOF photodetectors embedded in a second substrate, which two substrates are combined by a bonding technique to form a single chip. However, the cost of such a sensor is relatively high.

US2007051876A1 discloses an imager in which a visible image and an infrared image can be independently and simultaneously obtained. The solution proposed requires two substrates oriented perpendicular to each other, and a mirror oriented at 45° with respect to these substrates.

SUMMARY OF THE INVENTION

It is an object of embodiments of the present invention to provide a good semiconductor pixel unit for sensing modulated near-infrared light. The modulated near-infrared light may be indicative or representative of distance information.

It is an object of embodiments of the present invention to provide a semiconductor device and/or pixel unit that has an improved demodulation contrast for the near-infrared light, e.g. a higher (de)modulation contrast for a given (de) modulation frequency, or a same demodulation contrast for a higher (de)modulation frequency.

It is an object of embodiments of the present invention to provide a good semiconductor pixel unit that combines a sensor for sensing visible light and a sensor for sensing modulated near-infrared light. The modulated near-infrared light may be indicative or representative of distance information.

It is an object of particular embodiments of the present invention to provide such a pixel unit capable of simultaneously capturing said visible light and said modulated near-infrared light.

It is an object of embodiments of the present invention to provide a good semiconductor device that combines a two dimensional image sensor with a three dimensional time-of-flight (TOF) distance sensor.

It is an object of embodiments of the present invention to provide such a semiconductor device and such a pixel unit that can be manufactured in a cost efficient manner.

It is an object of embodiments of the present invention to provide such a semiconductor device that is capable of simultaneously capturing visible light information and near-infrared light information, both at a good resolution.

It is an object of particular embodiments of the present invention to provide such a semiconductor device and/or pixel unit that have an improved quality (e.g. increased sensitivity, e.g. improved demodulation contrast) of the TOF-information and/or an improved quality (e.g. increased spatial resolution) for the visible image.

This objective is accomplished by a device according to embodiments of the present invention.

According to a first aspect, the present invention provides a semiconductor pixel unit adapted for simultaneously sensing visible light and near-infrared light, the semiconductor pixel unit comprising: a single semiconductor substrate comprising a first semiconductor region and a second semiconductor region electrically separated from the first semiconductor region by means of an insulating region, the first semiconductor region comprising at least one visible light detector for detecting photoelectrons generated in the first semiconductor region by the visible light, means for generating a lateral electrical field in a region underneath the first semiconductor region, the electrical field being adapted for facilitating or promoting transport of photoelectrons generated in the second semiconductor region by the near-infrared light after passing through the first semiconductor region and through the insulating region, the second semiconductor region comprising at least one near infrared light detector located at the surface of the semiconductor substrate for detecting the photoelectrons generated in the second semiconductor region by the near infrared light.

It is an advantage of embodiments of the present invention that both visible light information and near-infrared (NIR) light information can be captured by a single structure. Moreover, that it can be captured simultaneously, which may be important when capturing moving objects, so as to provide consistent data.

It is a major advantage that the first and second semiconductor region are separated by an electrical insulating region, because in that way almost no visible light information can enter (e.g. drift to) the second semiconductor region, which significantly improves Signal to Noise Ratio (SNR) of the distance information. The second semiconductor region is also referred to herein as the TOF detection region.

It is a further advantage of the isolated block that it can help to reduce power consumption.

Embodiments of the present invention combine the functionality of a picture sensor and a time-of-flight (TOF) sensor with a minimum loss of performance and/or quality.

The first semiconductor region may comprise one or more sub-regions, which may, but need not be electrically separated from each other.

It is an advantage that, by locating the second semiconductor region underneath the first semiconductor region embedded in the same substrate, the available silicon area is (roughly stated) used twice for different functionality (like a building having two floors instead of only one).

It is an advantage of embodiments of the present invention that the visible light (e.g. color) information and near-infrared light (e.g. TOF) information originating from a same object will be captured in a consistent manner, because the infrared sensing area (second semiconductor region) of a pixel unit is located underneath the visible light (e.g. color) sensing area (first semiconductor region), and thus are necessarily aligned. In other words, substantially the same optical path is followed by the visible light components and infrared light components originating from the same object, but the visible light will penetrate less deep into the substrate than the near-infrared light.

It is an advantage of embodiments of the present invention that the at least one visible light detector is arranged for detecting charge carriers generated in the first semiconductor region of the substrate, in response to visible light incident on the substrate.

It is an advantage of embodiments of the present invention that the at least one near-infrared light detector is arranged for detecting charge carriers generated in the second semiconductor region of the substrate, in response to near-infrared light incident on the substrate.

It is an advantage of embodiments of the present invention that a lateral electrical field is present in at least part of the second semiconductor region, in particular below the first semiconductor regions, to move the photoelectrons generated in the second semiconductor region towards at least one corresponding detector (called: NIR detector). Thanks to the presence of the electrical field, this transfer occurs fast, so that the detected, e.g. measured near-infrared light detection can be used for distance measurement. For such applications, the semiconductor pixel unit is adapted for detecting modulated or pulsed near-infrared light emitted by a near infrared light emitter, e.g. a LED, typically located near the pixel unit (e.g. at a distance less than 5 cm).

The insulating region may have a horizontal segment (e.g. parallel to the substrate surface), and a vertical or inclined segment (e.g. perpendicular to the substrate surface) for separating the first and the second semiconductor region.

It is advantageous that the vertical or inclined segments extend from the top to the horizontal segment. Alternatively the insulating region may have a bathtub-shape. Such shapes can be generated e.g. using standard SOI technology, optionally in combination with the formation of trenches (e.g. so called Deep Trench Isolation).

It is an advantage that the insulating region has a predefined thickness and is chosen from a material (e.g. $SiO_2$) which is at least partly transparent for said near-infrared light. Preferably the transmission coefficient of the near-infrared light of interest (e.g. in the range of about 820 to 880 nm) is at least 0.6.

It is an advantage that the first and the second semiconductor regions are build in a single substrate, which can be achieved for example by using silicon-on-insulator (SOI) technology, rather than having to use two individual substrates which need to be produced separately, and need to be bonded together. This offers advantages in mechanical stability, but also in price.

It is an advantage that the first semiconductor region (with the one or more image subpixels, e.g. color subpixels) is located on top of the second semiconductor region ("NIR region"), because in this way the area occupied by both regions can be increased, e.g. maximized. This allows a high resolution of the image pixels, (for example at least 1 Megapixels), and allows relatively large pixels for detecting the NIR light.

It is an advantage of embodiments according to the present invention that the resolution of the "NIR pixels" may be in the same order as the resolution of the visible pixels, or can be chosen much smaller than the image resolution, depending on the application, depending on how many visible light detectors are present in the first semiconductor region. By increasing the size of the NIR region, the sensitivity of the near-infrared detection can be increased, thus a high sensitivity can be obtained without compromising the resolution of the visible pixels.

It is an advantage of embodiments according to the present invention that the "NIR pixels" do not require a large detector, e.g. photodiode, thus, they can be made smaller than image pixel sensors without a significant loss of sensitivity.

It is an advantage that the detectors may have separate readout circuitry, or that one or more readout-circuitry can be shared amongst different detectors.

The thickness of the first semiconductor layer is preferably in the range of 3 to 5 micron. This offers the advantage that a majority of the visible light is absorbed by the first semiconductor layer before reaching the second semiconductor region, hence the disturbance for the NIR detection is reduced.

Such a semiconductor pixel unit is ideally suited for use in a single-chip implementation in the field of 3D-camera systems.

The first semiconductor region and the second semiconductor region may contain mainly silicon, or mainly Germanium or SiGe or InGaAs or Si-compounds or Ge-compounds, or any other suitable semiconductor material.

The second semiconductor material may be the same material as the first semiconductor material, or may be a different material.

In a specific embodiment, the first and second semiconductor region comprises mainly (e.g. at least 95%) silicon, and the insulating layer comprise mainly (e.g. at least 95%) silicon-oxide or silicon nitride. The silicon-oxide may be deposited or grown on the second semiconductor layer. The silicon nitride may be deposited on the second semiconductor layer.

The projected area (in a plane parallel to the substrate surface) of the NIR detection region (where the photoelectrons are generated due to NIR light) may be about equal (+/−20%) to the sum of the projected areas of the image pixels (where the photoelectrons are generated by visible light).

According to a second aspect, the present invention provides a semiconductor pixel unit adapted for sensing near-infrared light, the semiconductor pixel unit comprising: a single semiconductor substrate comprising a first semiconductor region and a second semiconductor region electrically separated from the first semiconductor region by means of an insulating region; means for generating a lateral electrical field in a region underneath the first semiconductor region, the electrical field being adapted for promoting transport of photoelectrons in the second semiconductor region generated by the near-infrared light after passing through the first semiconductor region and through the insulating region; the second semiconductor region comprising at least one near infrared light detector located at the surface of the semiconductor substrate for detecting the photoelectrons generated in the second semiconductor region by the near infrared light.

The pixel unit according to the second aspect is very similar to the pixel unit of the first aspect, except that the pixel unit of the second aspect does not have provisions for sensing visible light, only for sensing NIR light.

The same advantages as were mentioned for the pixel unit according to the first aspect (except of course those related to visible light, e.g. resolution of the visible light pixels), are also valid for the pixel unit of the second aspect. In particular, the quality of the NIR signal is nearly the same for both pixel units, (inter alia) because the absorption of visible light by the material of the first semiconductor region remains substantially the same, even though the visible light is not measured and/or readout, thus the quality of the NIR signal is also substantially the same.

Unless explicitly mentioned otherwise, the embodiments described further, can be embodiments of the pixel unit according to the first aspect and/or embodiments of the pixel unit according to the second aspect.

In an embodiment, the pixel unit further comprises means for negatively biasing the first semiconductor region with respect to the second semiconductor region to affect the energy bands near the surface of the second semiconductor region over at least a portion of the insulation region, so that the photoelectrons generated in the second semiconductor region by the near-infrared light are pushed away from the insulating region.

In this embodiment the first semiconductor region is used as an electrode located on top of the insulating region, the electrode being transparent to at least NIR light, optionally also to visible light. The electrode may comprise or consist of polysilicon.

The inventors surprisingly found that the performance (e.g. in terms of demodulation contrast) of the NIR light detection can be drastically improved by applying such a bias voltage. For example, for a given (de)modulation frequency, the demodulation contrast can be increased. Or stated in other words, for a given demodulation contrast, the (de)modulation frequency can be increased. This translates into a more accurate distance measurement (or depth measurement), and/or in a higher resolution NIR image (in case of a pixel array).

In an embodiment, the insulating region between the first semiconductor region and the second semiconductor region comprises a buried oxide layer.

It is an advantage that a substrate with a buried oxide layer can be provided by the known SOI (silicon-on-insulator) technology, which is a mature technology.

The buried oxide layer may have a thickness of about 1.0 micron. The buried oxide layer may have a bath-tub shape, or a substantially horizontal shape (i.e. parallel to the substrate surface).

It is an advantage of using an oxide between the first and second semiconductor layer in that it does not allow or at least reduces transport of photoelectrons generated in the first region to travel to the second region (e.g. via diffusion), and vice versa. In this way the accuracy of both the visible light detection and of the NIR detection is increased.

It is an advantage of using an oxide between the first and second semiconductor layer in that it electrically decouples the means of creation of deep lateral electrical field drift region in the second semiconductor region from the first semiconductor region containing visible pixels which can be built using a well established CIS (CMOS image sensor) technology.

The buried oxide layer may have a bath-tub shape.

The buried oxide layer may have a shape comprising a major portion parallel to the substrate surface.

Preferably the buried oxide layer is a single layer, not a multilayer.

The buried oxide may have a flat shape, the first semiconductor region 101 residing on top of the buried oxide, the second semiconductor region being located underneath. The first semiconductor region 101 can e.g. be made of polysilicon or monocrystalline silicon.

The insulating region between the first semiconductor region and the second semiconductor region may further comprise at least one insulating trench.

It is an advantage that insulating trenches extend in a direction perpendicular to the surface, because this occupies less space than e.g. inclined edges. The trenches may be so called "DTI"-trenches ("Deep Trench Isolation"). Such trenches can be conveniently combined with a horizontal segment formed by SOI-technology to isolate a first (upper) region from a second (lower) region.

It is an advantage that such trenches can serve as an electrical barrier between the NIR-detectors and the visible light detectors, thus avoiding that photoelectrons generated in the first semiconductor region are detected by the NIR detectors, and that photoelectrons generated in the second semiconductor region are detected by image detectors.

Preferably the first semiconductor region is laterally surrounded by one or more insulating trenches. The trenches may extend from the semiconductor surface to the insulating layer.

It is an advantage of embodiments wherein the at least one trench extends from the surface of the substrate to the buried oxide layer, thereby completely electrically separating the first and the second semiconductor region. Although complete electrical separation can increase the accuracy and reduce cross-talk, complete electrical separation is not absolutely necessary for the device to work.

Preferably, the first semiconductor region is electrically completely isolated from the second semiconductor region by an oxide layer (e.g. in the vertical direction by a buried oxide layer, and in the horizontal direction by deep trenches).

In an embodiment, the first semiconductor region comprises at least two visible light detectors laterally separated by at least one insulating trench.

Although not strictly required for functioning, it is an advantage of embodiments of the present invention that individual visible light detectors present in the first semiconductor region are at least partly (with STI, shallow trenches) or completely (with DTI, deep trenches) isolated from each other by means of trenches, because of reduced cross-talk. Hence, such trenches offer an increased image quality. If the bathtub DTI are omitted it is an advantage of the insulating trench that it prevents a lateral electrical current flow (caused by the means for deep lateral electrical field generation) through the first semiconductor region; such a lateral electrical current through the first region, if present, can cause disruption in operation of the visible pixels, means for the deep lateral electrical field generation or excessive power consumption.

In an embodiment, the second semiconductor region has a non-constant doping profile as a means for generating said lateral electrical field.

It is an advantage of such embodiment that the electrical field for transporting the photoelectrons in the second semiconductor region is formed in a passive manner (without having to apply power). The non-constant doping profile should be monotonically decreasing to one or to both sides of the pixel unit, and should not have a local minimum.

In some embodiments the doping profile may have a local maximum near the middle of the first semiconductor region (in lateral direction). This is advantageous because the time to travel from a random point in the second semiconductor region where the photoelectron is generated to one of the detector regions, has a lower statistical spread than would be the case if the maximum doping profile is located near one lateral end of the first semiconductor region. This allows an improved accuracy of TOF-detection.

In other embodiments the doping profile may have a local maximum near one end of the first semiconductor region (in lateral direction). This can be advantageous in that only a single NIR-detector is required, which may save space and circuitry.

In an embodiment, the second semiconductor region has an intrinsic doping level, and the semiconductor pixel unit has a first detector element being an n-doped region and a second detector element being a p-doped region, so as to form a P-I-N structure.

It is an advantage of this embodiment that it has a reduced, e.g. negligible power consumption of the sensor. The NIR-signal can be readout by using an external demodulating circuit.

It is an advantage of this embodiment that the NIR-signal can be demodulated by modulating the reverse bias of the P-I-N structure.

In an embodiment, the second semiconductor region is a lowly p-doped region, and the semiconductor pixel unit has a first detector element and a second detector element, and further comprises a first p-doped contact region arranged in the second semiconductor region adjacent the first detector element, and a second p-doped contact region arranged in the second semiconductor region adjacent the second detector element, the first and the second contact regions allowing a voltage to be applied for creating said lateral drift field.

With "lowly doped" is meant having a doping level of in the order of $10^{12}/cm^3$.

An advantage of this embodiment is that it provides an easy way to perform a demodulation in the second semiconductor region by applying a modulated voltage over said first and second contact regions, (e.g. a sine wave or block wave etc.) which modulates the current flowing through the second semiconductor region.

In an embodiment, the semiconductor pixel unit further comprises at least one readout circuit for reading out data of the visible light detector.

The readout circuit may have for example a classical 3T or 4T architecture. Each image detector, e.g. photodetector, may have its proper readout circuit. Alternatively one readout circuitry can be shared (time-multiplexed) by more than one image detector.

In an embodiment, the semiconductor pixel unit further comprises at least one readout circuit for reading out data of the near infrared light detector.

The readout circuit may have for example a classical 3T or 4T architecture. Each NIR-detector, e.g. photodiode may have its proper readout circuit, or readout circuitry can be shared (time-multiplexed) by more than one NIR detector, or by NIR detectors and image detectors, or the readout circuitry may also be external.

In an embodiment, the semiconductor pixel unit further comprises a demodulator, (e.g. a mixer), having a first input connected to the NIR detector and a second input for receiving a modulation waveform from a modulator, and having an output for providing a demodulated NIR signal to a distance determination circuit.

It is an advantage of using heterodyning as a demodulation technique, because it is relatively simple and reliable. By such demodulation, the DC-offset caused by e.g. sunlight may be automatically removed.

It is an advantage of using a demodulating circuit outside of an array to maximize the photo sensitive silicon area for applications which require distance information with low spatial resolution.

In an embodiment, the semiconductor pixel unit further comprises said demodulator adapted for operating at a demodulation frequency of at least 10 MHz, for example at least 20 MHz, for example at least 40 MHz, for example at least 80 MHz, for example at least 100 MHz, for example at least 150 MHz, for example at least 200 MHz, and a predefined DC voltage source for providing the bias voltage, the bias voltage being chosen such that the demodulation contrast of the pixel unit is at least 50%.

The semiconductor pixel unit may be part of a semiconductor sensor, further comprising said modulator adapted for operating at a frequency of at least 10 MHz, for example at least 20 MHz, for example at least 40 MHz, for example at least 80 MHz, for example at least 100 MHz, for example at least 150 MHz, for example at least 200 MHz.

In an embodiment, the semiconductor pixel unit further comprises at least one microlens arranged on top of said at least one visible light detector.

It is an advantage of using microlenses that they concentrate (focus) incident light on the metallization-free photo sensitive silicon area. This improves the visible and NIR pixel sensitivity and reduces cross-talk.

Although not essential for the working of the device, microlenses can decrease cross-talk, and thus improve image quality, and increase the accuracy of TOF detection.

In an embodiment, the semiconductor pixel unit further comprises at least one color filter arranged on top of said at least one visible light detector, the color filter having a characteristic for passing visible light in a first predefined band of spectrum, and for blocking or at least attenuating visible light in a second predefined band of the spectrum, and for passing a predefined band of near infrared light.

The predefined band of near-infrared light may e.g. be a band from 800 to 900 nm, or a band from 900 nm to 950 nm, or any other band in the NIR-spectrum.

Color filters can be used to make the image sensor sensitive for particular colors, but the use of color filters are not essential for the present invention, because it is also possible to make a grayscale image sensor.

Preferably multiple color filters are present, passing and blocking different bands in the visible spectrum, such as a red, green and blue band, but other color filters can also be used. By doing so, the image sensor can detect different colors of a scene, and effectively is a color sensor.

In an embodiment, the semiconductor pixel unit further comprises an optical filter having a characteristic for passing light in a first band from about 380 to about 750 nm, and for blocking or at least attenuating light in a second band from about 750 nm to a predefined first frequency and for passing near-infrared light in a third band from the predefined first frequency to a predefined second frequency, whereby the predefined first frequency is a value in the range of 750 nm to a wavelength below the maximum wavelength of semiconductor sensitivity (e.g. about 1100 nm for silicium), and the predefined second frequency is a value in the range from the predefined first frequency to the maximum wavelength of semiconductor sensitivity.

In an example, the second band is a band from about 750 nm to about 800 nm, and the third band is a band from about 800 nm to about 900 nm. In another example, the second band is a band from about 790 nm to about 900 nm, and the third band is a band from about 900 nm to about 950 nm, but other second and third bands are also possible.

It is an advantage of using such a filter, when used for time-of-flight applications, because it removes most of the disturbance signals, thereby improving the accuracy of TOF-information.

According to a third aspect, the present invention provides a semiconductor sensor comprising: a sensor array comprising a plurality of semiconductor pixel units according to the first aspect; a light source for emitting a modulated or pulsed near-infrared light to be reflected against objects in a scene to be captured; a distance determination circuit for deriving distance information based on the emitted near-infrared light and the measured reflected near-infrared light.

The light source may be a LED or laser, e.g. a laser diode.

The means for deriving distance information and/or color information may comprise a processing unit adapted for performing calculations, such as e.g. color conversion, using algorithms known in the art.

In an embodiment, the semiconductor sensor further comprises: said modulator, adapted for operating at a predefined frequency of at least 20 MHz, and said demodulator adapted for operating at the same predefined frequency, and a predefined DC voltage source for providing the bias voltage between the first and second semiconductor region, the bias voltage preferably being chosen such that the demodulation contrast of the pixel unit is at least 50%.

According to a fourth aspect, the present invention provides a digital camera comprising the semiconductor sensor of the second aspect. Preferably, the digital camera comprises only a single semiconductor substrate (not two) and does not contain a mirror (e.g. a mirror as described in US2007051876A1).

In an embodiment, the digital camera further comprises a light source and circuitry for transmitting modulated infrared or near-infrared light, and circuitry for demodulating the received near-infrared light and for converting it into distance information.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 is a simplified schematic drawing of a basic structure of a semiconductor pixel unit according to an embodiment of the present invention for simultaneously sensing visible light and NIR-light.

FIGS. 2(a) and 2(b) show a variant of the structure of FIG. 1, wherein the second (lower) semiconductor region has a non-constant doping profile as a means for creating a lateral electrical field.

FIG. 3 shows another variant of the structure of FIG. 1, wherein the second (lower) semiconductor region is substantially un-doped (i.e. intrinsic), and wherein the first semiconductor region contains a first detection region being an n-doped region, and a second detection region being a p-doped region, so as to form a "P-I-N" structure.

FIGS. 4(a) and 4(b) show another variant of the structure of FIG. 1, wherein the second (lower) semiconductor region is a lowly p-doped region, and wherein each of the first and second detection region comprises a p-doped region adjacent a n-doped region.

Figure 5:
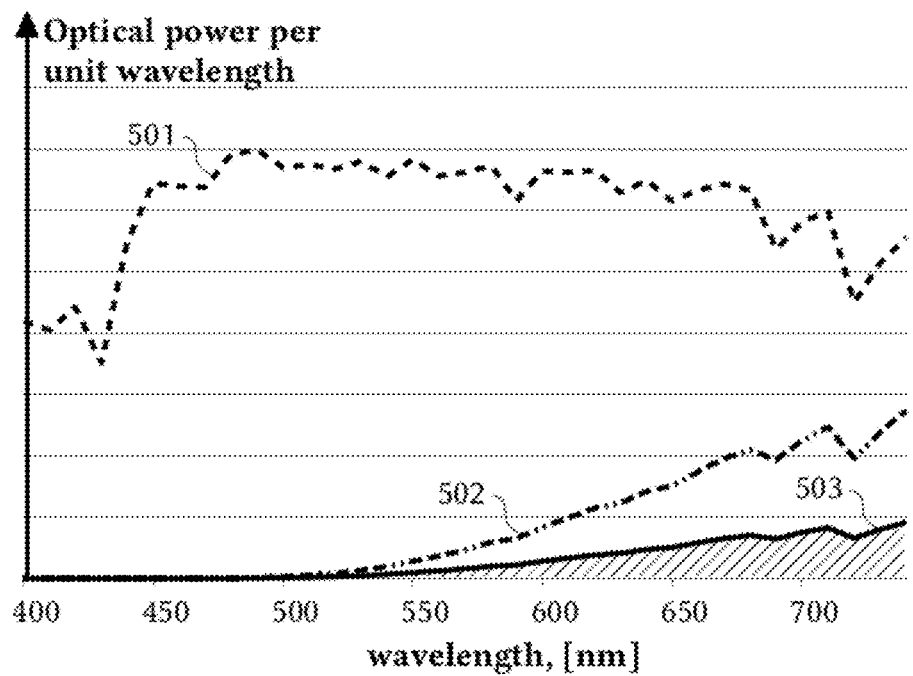
FIG. 5 shows a typical spectrum of sunlight, and a transmission characteristic of silicon for visible light, and the product of both, showing a typical sunlight spectrum reaching the second (lower) semiconductor region.

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in the present invention reference is made to "visible light", the portion of the electromagnetic spectrum that is visible (can be detected) by the human eye is meant. A typical human eye is sensitive to wavelengths of about 390 nm to about 700 nm. Different wavelengths are sensed by the human eye as different colors, for example 450 to 495 nm is sensed as "blue", 495 to 570 nm is sensed as "green", and 620 to 750 nm is sensed as "red". Therefore, the corresponding data is referred to herein as "color data" or "color information" or generally as "image information".

Where in the present invention reference is made to "near-infrared" light, (abbreviated as NIR), reference is made to electromagnetic waves having a wavelength in the range of about 750 nm to about 1150 nm, or a subset thereof, such as for example a range of about 800 nm to about 900 nm.

Where in the present invention reference is made to "visible subpixel" or "color subpixel" or "visible pixel" (for example "red subpixel" or "red pixel") or "visible light sensor", reference is made to that part of the semiconductor device comprising the first (upper) semiconductor region (typically 5 micron deep) where photoelectrons are generated by incident visible light. This area comprises a "sensor element" (or detection element) for measuring said photoelectrons. This sensor element is referred to herein as "image photodetector" or "visible light detector".

Where in the present invention reference is made to "NIR subpixel" or "NIR pixel" or "near infrared sensor", reference is made to that part of the semiconductor structure comprising the second (lower) semiconductor region where photoelectrons are generated by incident near infrared light, the main part of which is located below the insulating layer, but it also includes the space between individual insulation layers, where a.o. electrical contact elements may be provided for generating an electrical field in the second semiconductor region. This area also comprises a "sensor element" for measuring said photoelectrons. This sensor element is referred to herein as "near infrared detector" or sometimes also as "time of flight detector".

Where in the present invention the expression "the optical filter allows passage of a given frequency range" is used, what is meant is that the transmission coefficient in that frequency range is relatively high, e.g. at least 0.6.

Where in the present invention the expression "the optical filter blocks or attenuates a given frequency range", what is meant is that the transmission coefficient in that frequency range is relatively low, e.g. at most 0.4.

In the present invention the terms "distance information" and "depth information" are used as synonyms. The term "time of flight information" (abbreviated as "TOF") corresponds to the time required for light to travel over this distance.

Although it is contemplated that the present invention works for many several semiconductor materials and/or several materials of the insulating layer, the invention will be explained for silicon as the first & second semiconductor material and silicon-oxide as the material of the insulating layer. But the invention is not limited to only these materials.

As illustrated in FIG. 1 to FIG. 16, the present invention proposes a semiconductor pixel unit capable of capturing both visible light (e.g. intensity information or color information) and near-infrared (NIR) light. Later, in FIG. 17, variants of this structure will be discussed not having provisions for capturing visible light, only for capturing NIR light.

In all cases, the NIR light may comprise a reflected near-infrared light component originating from a pulsed or modulated light source (emitter), typically located in the vicinity of the semiconductor pixel unit or sensor array comprising same. By determining the time difference or phase difference between the emitted light and the reflected light or between corresponding electrical signals, "time-of-flight" (TOF) information or "distance" information can be derived. An array of such pixel units is thus capable of capturing two-dimensional image information (e.g. color data), as well as three-dimensional information (e.g. depth information for each pixel position of the array).

As mentioned in the background section, separate devices for either measuring color information or depth information are known in the art, and it is not easy to combine these two functions in a single integrated device, a.o. because TOF sensors and image sensors impose different requirements for the optical system: (1) image sensors should detect only visible light and not near-infrared light, whereas TOF sensors should detect only near-infrared light and not visible light; (2) image detectors should have a relatively small size for providing a high spatial resolution (e.g. at least 1 Megapixels), whereas TOF detectors should have a relatively large size (typically in the order of 15 micron×15 micron) for providing a high sensitivity. Hence, providing a pixel unit where color detectors and NIR detectors are interleaved, for example as four square subpixels of equal size, whereby three detectors are arranged for measuring color information (e.g. red, green and blue), and one detector is arranged for measuring NIR information, does not provide a good solution because 75% of the NIR power would be lost. Drastically increasing the size of the NIR detector while decreasing the size of the color detectors is not a good solution either, because the quality of the visual information would severely suffer. It is therefore a challenge to propose a good pixel unit capable of detecting both color information and NIR information.

FIG. 1 is a simplified schematic cross sectional drawing of the basic structure of a semiconductor pixel unit 120 according to embodiments of the present invention. It shows a single semiconductor substrate comprising a first semiconductor region 101 for detecting visible light (e.g. color information). The first semiconductor region may contain a single region, or multiple individual regions further referred to herein as visible pixels or color subpixels. The first semiconductor region 101 is arranged on top of, and is electrically isolated from a second semiconductor region 104 by means of an insulating layer 102. In the example shown, the insulating layer 102 is a combination of a buried oxide layer (portion that is substantially parallel to the surface), abbreviated as "BOX", and upright regions (e.g. portions which are substantially perpendicular to the surface). The horizontal part of this insulating layer can be manufactured e.g. using SOI (Silicon On Insulator) technology, the upright regions can be manufactured e.g. by the formation of trenches, e.g. deep trenches, known as "DTI". The areas between horizontal BOX parts of different pixel units may be formed for example by making use of the so called "handle wafer contact" feature, which is known in the field of SOI-technology.

The insulating layer 102 can be also implemented as a flat layer, parallel to the surface, with the first (upper) semiconductor region 101 above it, and the second (lower) semiconductor region 104 beneath it.

The present invention proposes a semiconductor pixel unit 120 and a semiconductor sensor 100 comprising same for combining near-infrared detectors (e.g. fast near-infrared light sensitive pixels) and visible light detectors (e.g. visible range light sensitive pixels) on a single substrate, in a way that avoids the sensitivity-versus-resolution tradeoff mentioned above. This is achieved by splitting the sensitive silicon volume (e.g. the upper 20 micron near the surface) into two regions 101 (upper region), 104 (lower region) separated by an insulating medium 102 which is substantially transparent to near-infrared light (e.g. has a transmission coefficient of at least 0.60 in the near-infrared spectral range of about 800 nm to about 900 nm) and by creating a drift electrical field "E" in the lower region for fast transport of the photoelectrons generated in the second semiconductor region 104 by incident NIR light. In practice, a large portion of the incident NIR light originates from sunlight, while only a relatively small fraction originates from a modulated light source, e.g. a pulsed light source, also referred to herein as "emitter". Only the latter portion contains the TOF-information, while the former portion is undesired signal. However, the TOF-information, which is the information of interest, can be extracted by demodulation techniques.

When exposed to incident radiation, visible range photons are mainly absorbed in the first (upper) semiconductor region(s) 101, where visible light detectors 108 are located for measuring the amount of charge carriers (e.g. photoelectrons) created in the first semiconductor region(s) 101 by absorption of the visible light, as schematically indicated by the arrows with label "R" (red) and "G" (green), as an example only.

NIR range photons are mainly absorbed in the second (lower) semiconductor region 104 located below the isolation layer 102, after passing through the first semiconductor region 101 and through the insulation layer 102, both of which are substantially transparent for the NIR light, as schematically indicated by the arrow with label "N". The NIR light creates charge carriers (e.g. photoelectrons) in the second (lower) semiconductor region 104, which charge carriers are detected by one or more detectors, e.g. photodetectors 105 after being transported thereto due to the presence of an electrical field Edrift, which is present or created in the second semiconductor region 104 for facilitating fast transport of said charge carriers.

In order to work fast enough for extracting TOF-information, a lateral electrical drift field must be present in the second (lower) semiconductor region 104 for transporting the NIR signal to one or more detection regions 105 (e.g. photodetection regions which may be located at the surface) in a sufficiently fast way (mere diffusion is not fast enough). The presence of the electrical field is essential for allowing detection of the modulated NIR information at a speed (bandwidth) sufficiently high for allowing detection with sufficient accuracy of the emitted NIR signal, after reflection on an object, the distance between the object and the sensor to be measured, and after being added for example with the sunlight spectrum. The higher the bandwidth, the better the distance resolution, e.g. if a TOF camera has 1 cm distance resolution at 25 MHz, the resolution of the same TOF camera at the same average emitted optical power, using the principles disclosed here, operating at 250 MHz is 1 mm. In embodiments of the present invention, said bandwidth is at least 10 MHz, e.g. at least 25 MHz, e.g. at least 50 MHz, e.g. at least 100 MHz, e.g. at least 200 MHz, e.g. at least 300 MHz. The electrical field Edrift can be created in several ways, some examples of which will be described in relation to FIG. 2 to FIG. 4.

It is a major advantage of at least some embodiments of the present invention over some prior art (e.g. US2013/0234029) that an insulating layer 102 is used to separate the first and the second semiconductor regions 101, 104, wherein the first semiconductor layer 1 and the insulating layer 2 are substantially transparent to NIR light, because such a structure is easier (and cheaper) to produce than a structure composed of two separate substrates which are bonded together. Indeed, such a process requires two wafers which need to be separately processed, and in order for the top wafer to be bonded to the lower wafer, it needs to be thinned down to about 3 to about 5 micron, which typically requires a third transparent substrate wafer to guarantee mechanical stability. In contrast, even though SOI-wafers are somewhat more expensive than standard silicon wafers, only a single such wafer is needed, and no thinning step and no bonding step is required, resulting in an easier process, and in a cheaper device which is also mechanically more stable.

By physically arranging the first semiconductor region 101 (also referred to as "color detection region") on top of the second semiconductor region 104 (also referred to as "NIR detection region), the size of both the color detection region(s) and the NIR detection region can be increased (as compared to a planar interleaved topology).

The structure shown in FIG. 1 has four image detection regions 101 (subpixels), and one NIR detection region 104, but the invention is not limited thereto, and the first semiconductor region 101 can also have more than four, or less than four image detection regions 101, for example only one or only two or only three. When a color filter (e.g. a red or green or blue or any other color) is arranged above or on top of said image detector, each image detector will act as a specific color detector, for example for sensing red light, green light or blue light. This will be further discussed in relation to FIG. 8 and FIGS. 9(*a*)-9(*e*). Color filters are known in the art, and can for example be made from pigmented resin, as is known for example from US2013/0214161(A1) and U.S. Pat. No. 5,619,357, both incorporated herein by reference. Such color filter(s) is/are however not mandatory for the present invention, which also works for an image sensor having e.g. grayscale image pixels and TOF pixels. For the sake of explaining FIG. 1, it is assumed that an R, G and B color filter are arranged on top of or above the four image pixels 101*a* to 101*d*, (101*b* and 101*c* located between pixels 101*a* and 101*d*, but not being indicated not to overload the drawing).

Advantageously the four color detection regions 101*a* to 101*d* are further at least partly, but preferably completely electrically separated from each other by means of trenches, e.g. DTI trenches (deep trench isolation). This offers the advantage of reducing electrical cross-talk between adjacent color detectors, because the risk that a photo-electron generated under e.g. a red subpixel would falsely end-up in the photodetector of e.g. green subpixel is reduced.

It is a major advantage of the insulating layer 102 that it helps to avoid the risk that charge carriers (e.g. electrons or holes) created by NIR photons in the second semiconductor region 103, 104 migrate towards the color detectors 108 rather than to the NIR detectors 105, and would thus be incorrectly interpreted as color information, and vice versa, that charge carriers created by visible light in the first semiconductor region(s) 101 would incorrectly migrate towards the NIR photodetectors 105, and be incorrectly interpreted as NIR-information. This separation is achieved by the intermediate insulation layer 102, which may for example comprise a buried oxide layer (BOX). It is an advantage that a buried oxide layer allows passage of NIR light without too much attenuation. The production of a buried oxide layer and of shallow or deep trenches is known in the field of SOI-technology.

Detection regions 105 (for NIR light) and 108 (for visible light) are the means for photo signal detection. It can be implemented e.g. as a simple photodiode, a pinned photodiode or a demodulating detector like PMD or CAPD or any combination thereof. They can be readout by a readout circuit such as, for example, a well-known "3T", "4T" or "TIA"-structure.

It is pointed out however that not every detection region needs to have its own readout circuitry, and it is also possible to use a single readout circuit to read-out (e.g. sequentially) multiple detection regions.

As can be seen in FIG. 1, the detection region 108 of the visible pixels can be larger than the detector regions 105 of the NIR pixels.

The photodetectors 108 for capturing the charge carriers generated by the visible light and the photodetectors 105 for capturing the charge carriers generated by the NIR light, are preferably arranged near the top surface of the substrate.

The pixel unit 120 may further comprise one or more readout circuits 106 adapted for reading out the accumulated charges stored on the photodetectors 108, 105. In the example of FIG. 1 each photodetector region 108 has its own readout circuitry, but that is not absolutely required, and a single readout-circuit 106 may be shared by one or more or even all the photodetectors 108 of the pixel unit 120, even by the NIR photodetector 105.

The NIR detection regions 105 may have their own dedicated readout circuitry (not shown in FIG. 1, but see for example FIG. 8), but that is not essential for the present invention, and the NIR detector regions 105 could also be readout by one of the readout circuits 106 of the image pixels (by time-sharing), or could be readout by external readout circuitry directly connected to the detector region(s) 105. But it is also possible to readout the demodulated or non-demodulated NIR-signal directly, as will be discussed further in relation to FIG. 2 to FIG. 4.

It is an advantage of the structure of FIG. 1 that the visual image data (color data) and the NIR data (e.g. distance data) can be captured (detected, sensed) simultaneously, irrespective of whether the readout occurs simultaneously (in parallel) or sequentially. This is advantageous e.g. for data-consistency, especially when capturing moving objects.

In a variant of the embodiment shown in FIG. 1, more than four image pixels or less than four image pixels can be provided in the first semiconductor region 101, between pairs of TOF detectors 105, for example a single, only two or only three image pixels, and each of them may have its own readout-circuitry 106, or the readout circuitry of some or all of the image pixels may be shared. In a particular embodiment the first semiconductor region has exactly three image pixels, for example for detecting Red, Green and Blue, and only two readout circuits, one of which readout circuits being arranged for reading out two color detectors (e.g. Red and Green), the other readout circuit being arranged for reading out one color detector (e.g. Blue) and the TOF detector 105.

Finally, it should be mentioned that, although FIG. 1 shows the electrical field Edrift oriented only in one direction (the arrows pointing from detector 105 on the left to detector 105 on the right), the field Edrift may also be an alternating field, an example of which will be described in FIG. 4.

Several ways are possible to generate the lateral electrical field Edrift, three examples will be shown in FIG. 2 to FIG. 4, but the invention is not limited thereto, and other suitable ways of generating a lateral electrical field underneath the first semiconductor region 101 may also be used.

FIG. 2(a) shows a variant of the structure of FIG. 1, wherein the second semiconductor region 204 has a non-constant doping profile. FIG. 2(b) shows the substrate doping level 207 taken in a plane A-A. For the case of SOI processing this doping profile can be approximated, for example, by a step doping 208 of the handle wafer, followed by a high temperature operation (drive in) before further SOI processing. This approach can be used for small pitch of the time-of-flight subpixels since the practically achievable electrical field strength E is rather low (typically in the order of −0.5V/pixel pitch).

FIG. 2 also shows another feature, which is not intrinsically linked with the non-constant doping profile, but is related to a possible way of reading out the detector 205. The photoelectrons caused by NIR light may be detected by a reverse biased diode followed by a demodulating circuit, e.g. a mixer 209 (symbolically represented by the circle and X), such as well known analog circuits and techniques (e.g. Gilbert cells or simple switches) or as more sensitive charge domain demodulator devices, such as majority current assisted photonic demodulator, photonic mixing devices, optical efficiency modulation devices or any other device with demodulation capabilities.

It is noted that the invention is not limited to the particular doping profile shown in FIG. 2(b), and other doping profiles may be used as well, as long as the maximum doping is somewhere underneath the first semiconductor region, e.g. in the middle, and the doping profile is monotonically decreasing towards an area below the one or more detectors 205. Such a doping profile will create an electrical field (indicated by the arrows) to move photoelectrons towards the detector regions 205a, 205b, in a direction opposite the arrows.

FIG. 3 shows another variant of the structure of FIG. 1, wherein the second semiconductor region 304 is substantially un-doped (i.e. intrinsic), having a first and second detector 305a, 305b in the form of a first resp. second contact element. The first contact element 305a is a n-doped region, and the second contact element 305b is a p-doped region, so as to form a P-I-N structure. In this embodiment, the deep electrical field "E" is created using a lateral p-i-n structure comprising an n-doped region 305a, intrinsic or extremely low doped region 304, and a p-doped region 305b. A reverse bias voltage Vbias, applied to this p-i-n structure, creates a lateral electrical drift field "E" within the second semiconductor region 304. The photoelectrons generated in region 304 drift towards the detector region 305a for creating a current signal. The n-region together with intrinsic or lightly doped p-substrate creates a NIR-photodetector.

The same demodulation technique, using a modulator 309 as discussed in relation to FIG. 2 is also shown here, but other ways of readout are also possible. For example, the photocurrent signal through region 305a may also be readout and processed in another way (e.g. time domain processing, e.g. correlation) by a processing unit (not shown) to obtain the time-of-flight distance information. And it is also possible to connect several detector regions 305 of a plurality of pixel units of a semiconductor sensor together to form (or emulate) bigger distance pixels to increase sensitivity, as shown for example in FIG. 6. Demodulation can be also done by modulating a reverse bias of the diodes.

FIG. 4 shows another variant of the structure of FIG. 1, wherein the second semiconductor region 404 is a lowly p-doped region. It further comprises a first and second detection element, each comprising an n-doped detection region 405a, 405b adjacent a p-doped contact region 426a, 426b. The embodiment shown comprises two p-doped regions 426a, 426b to create ohmic contacts to the lowly p-doped second region 404, two n-doped detector regions 405a, 405b adjacent to the two p-doped regions. A voltage source 412, connected between the two p-doped regions 426a, 426b (acting as electrical contacts), creates a majority hole current flow inducing a gradual voltage drop over the resistance of the second semiconductor region 404, thus creating a deep lateral drift region 403. The photoelectrons drift towards the p-doped region 426a or 426b, whichever has a higher potential, once approaching a p-type region 426 the photoelectrons are picked up by the electric field of the reversed biased diode formed by n-doped detector regions 405a, 405b in the second semiconductor region 404, which is lightly p-doped.

If the voltage source 412 is a DC voltage, the photocurrent signal through detector regions 405a, 405b needs to be demodulated or processed in another way (e.g. time domain processing) to obtain the time-of-flight distance information. If the voltage source 412 is a voltage having a modulated waveform synchronous to the near-infrared active illumination signal (which may e.g. be a modulated or pulsed LED signal), the demodulation can be done in the second semiconductor region 404 itself: the modulated voltage source 412 will then create a varying electric field Efield in the deep lateral drift region 403 decomposing the photocurrent into an in-phase component and an out-of-phase components collected separately by the detector regions 405a, 405b.

In all the examples shown in FIG. 1 to FIG. 4, the substrate can optionally be biased by a negative voltage source "−Vsub" (with respect to the voltages used to create the drift field E) to provide an additional vertical electric field component (not shown) which may further improve the speed and sensitivity of the time-of-flight distance sensor. It is noted that that this bias voltage Vsub is different from the bias voltage Voxbias which will be described with reference to FIG. 12 to FIG. 17. Both voltages Vsub, Voxbias may be present, and they can be chosen independently.

As explained above, the main purpose of the first semiconductor regions 101, 201, 301, 401 is detection of an image signal (i.e. visible light signal, e.g. color or brightness information) and absorption of (most of) the visible range of the spectrum of the impinging light signal. The operation of the subpixels (e.g. photodetectors) within the first semiconductor regions 101, 201, 301, 401 is the same as the operation of conventional image sensor pixels since the electric field created in the second semiconductor regions 104, 204, 304, 404, e.g. the deep lateral drift regions 103, 203, 303, 403, is decoupled from the image sensor subpixels by the insulation medium 102, 202, 302, 402. The image sensor subpixels can be implemented, for example, as 3T or 4T pixels with pinned photodiodes.

The sunlight is a required signal for obtaining visible information (e.g. color information), but is an undesirable signal for the time-of-flight distance sensor since it degrades the signal to noise ratio SNR and may cause a saturation of the signal readout circuits. By choosing an appropriate thickness, the first semiconductor region 101, 201, 301, 401 absorbs the major part of the visible sunlight spectrum while letting the near-infrared signal pass through to the second semiconductor regions 104, 204, 304, 404 where the deeply generated photoelectrons are transported by the lateral electrical field "E" to the detector regions 105, 205, 305, 405.

FIG. 5 shows a typical visible sunlight spectrum (at sea level) depicted in curve 501, incident to a semiconductor device. After passing through a 5.0 micron thick first semiconductor region, the sunlight spectrum is attenuated resulting in the curve 502. If the pixel unit, or semiconductor sensor device is covered with a color filter (array) to form a color image sensor, the sunlight power 503 reaching the second semiconductor region is further reduced, since each image sensor pixel color filter is passing only a limited part of the visible sunlight spectrum, e.g. only a blue, green or red part. The average sunlight spectral power after passing through the color filter array and the first semiconductor region is depicted by the curve 503. The total sunlight power (integrated over the visible wavelength range) that reaches the second semiconductor region (area of the hatched region under curve 503) is typically less than 5% of the visible sunlight power impinging on the chip. At the same time, the near-infrared light attenuation is not significant, as almost 90% of the 900 nm near-infrared light is passing through the first semiconductor region (assuming the color filter array is substantially transparent to near-infrared light), as will be further discussed in relation to FIGS. 9(a)-9(e).

Here above, a semiconductor pixel unit is described, capable of simultaneously sensing image information and distance information with an improved sensitivity as compared to the prior art, and/or which can be produced in an simpler and cheaper manner. This pixel unit can be embodied in a two-dimensional array for forming a 3D image sensor. Several topologies can be chosen with regards to e.g. the number and kind of the image subpixels in the first semiconductor region. Two examples are described below, in relation to FIG. 6 and FIG. 7, but the invention is not limited to these examples, and will also work with other topologies.

Figure 6:
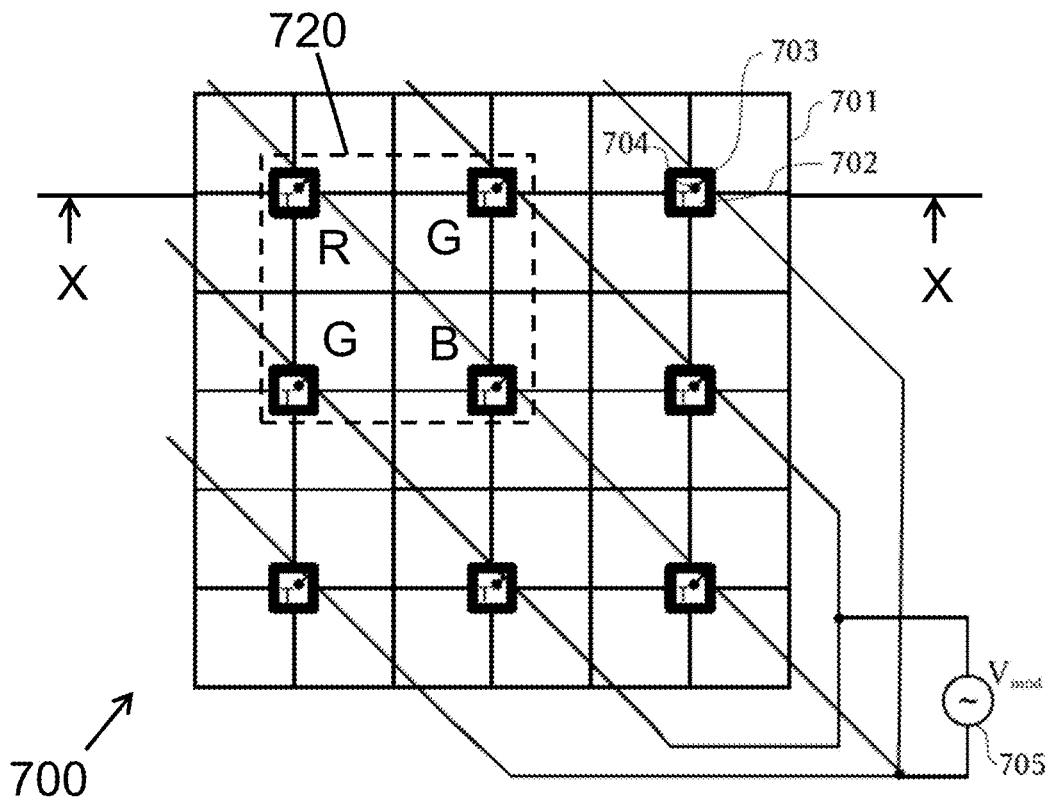
FIG. 6 shows a top view of a possible arrangement of a sensor array comprising multiple pixel units, whereby a plurality of NIR detection regions are interconnected, according to an embodiment of the present invention.

FIG. 6 shows a top view of a possible arrangement of a sensor device according to the present invention comprising a plurality or array of pixel units 720 (indicated in dashed line) according to the present invention. If the drawing of FIG. 1 would have two image subpixels (instead of four) in the first semiconductor region 101, it could be seen as a cross section of the pixel unit 720 of FIG. 6 according to the line X-X.

In the example shown in FIG. 6, each pixel unit has four image subpixels, e.g. organized in a Bayer-like pattern, each group having one small distance subpixel (indicated with reference T), each distance subpixel comprising a contact 704 to the second semiconductor region which is located underneath the four color subpixels, a small n-doped detection region and its own dedicated readout circuit. Of course, the present invention is not limited to this particular RGGB-color-pattern, and other color patterns may also be used. In the example shown in FIG. 6, the distance subpixel 702 may have no dedicated readout circuit, hence the readout circuit of one of the four color pixels can be used for reading out the information of the distance subpixel.

FIG. 6 can also be seen as a sensor array comprising the combination of:
a two-dimensional array of image subpixels 720 located in first semiconductor regions, each first semiconductor region comprising four image subpixels, and
a two-dimensional array of time-of-flight distance subpixels 702 located in a second semiconductor region, as described above, each distance pixel comprising approximately the same area as the four image sub-pixels.

A deep lateral drift region is created in the second regions underneath the first regions by any of the means described above in relation to FIG. 1 to FIG. 4, preferably the majority current assisted drift field induction method shown in FIG. 4, since it allows easy electric field modulation over extended areas. The image sensor array operates in a conventional mode, in the sense that visible light creates photoelectrons in the first semiconductor regions, which photoelectrons are accumulated on color detectors, and create a charge which is read by means of a classical readout circuit. The photoelectrons that are generated deeply in the second semiconductor region (by the near-infrared photons) are drifting fast towards the TOF detectors (also referred to as time-of-flight distance subpixels). The time-of-flight distance sensor subpixels 702 comprise means for establishing a deep lateral drift region, a detection region for measuring the photocurrent induced in the second semiconductor region. There is no need of the large sensing diode for the time-of-flight pixels so they can be made smaller than image pixel sensors without a significant loss of sensitivity. The readout of the time-of-flight signal can be done using a dedicated readout circuit (e.g. 3T or 4T) or the readout circuit can be shared with one of the adjacent image sensor pixel. If the deep lateral drift field is constant the time-of-flight distance sensor subpixels 702 may include means for time-of-flight estimation such as e.g. a demodulation device or a time-domain signal processing block. The demodulation can also be done outside of the array by connecting a distance subpixel or shorted group of distance subpixels to an external demodulating circuit.

Figure 7:
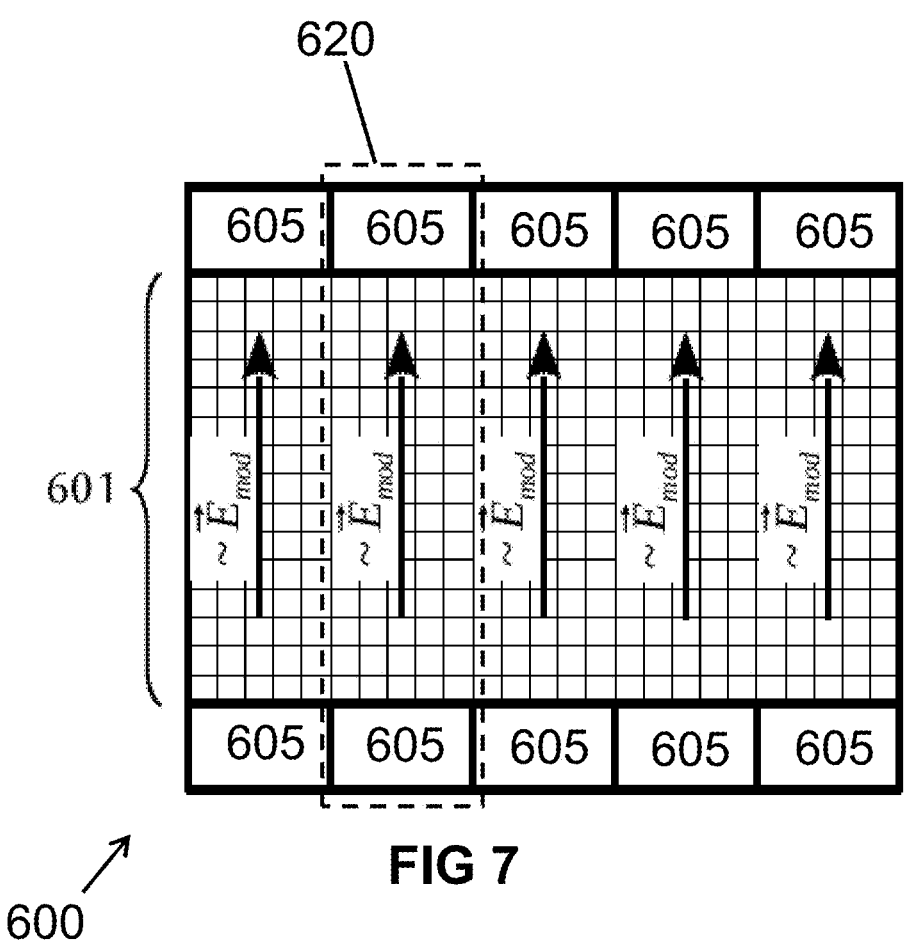
FIG. 7 shows a top view of another possible arrangement of a sensor array comprising multiple pixel units according to an embodiment of the present invention.

FIG. 7 shows a top view of another possible arrangement of a sensor array comprising multiple pixel units 620 according to an embodiment of the present invention. Each pixel unit 620 of the sensor device shown in FIG. 7 comprises 5×15=75 visual light detectors and acts as a single distance detector, but operates in the same manner as described for the sensor device of FIG. 6.

Also this sensor device 600 comprises an array of image sensor pixels 601 located in the first semiconductor region, an array of time-of-flight distance sensor subpixels 605 located in the second semiconductor region which is electrically isolated from the first semiconductor region by an insulating medium transparent to NIR light. A modulated deep lateral drift region is induced in the second semiconductor region by a modulated voltage source.

The time-of-flight distance sensor subpixels 605 (NIR detectors) of the preferred embodiment comprise means for establishing a modulated deep lateral drift region, and a detection region for measuring the photocurrent induced in the second semiconductor region. The preferred embodiment utilizes a majority hole current assisted method of the modulated lateral drift field induction via ohmic contacts to the second semiconductor region. A time-of-flight photo charge signal is delivered to the detection region by the induced deep lateral drift field from underneath the imaging pixels.

This sensor embodiment fits well many real world applications that do not require a high spatial resolution of the distance information, for instance, an automotive side view camera with a blind spot monitoring.

Figure 8:
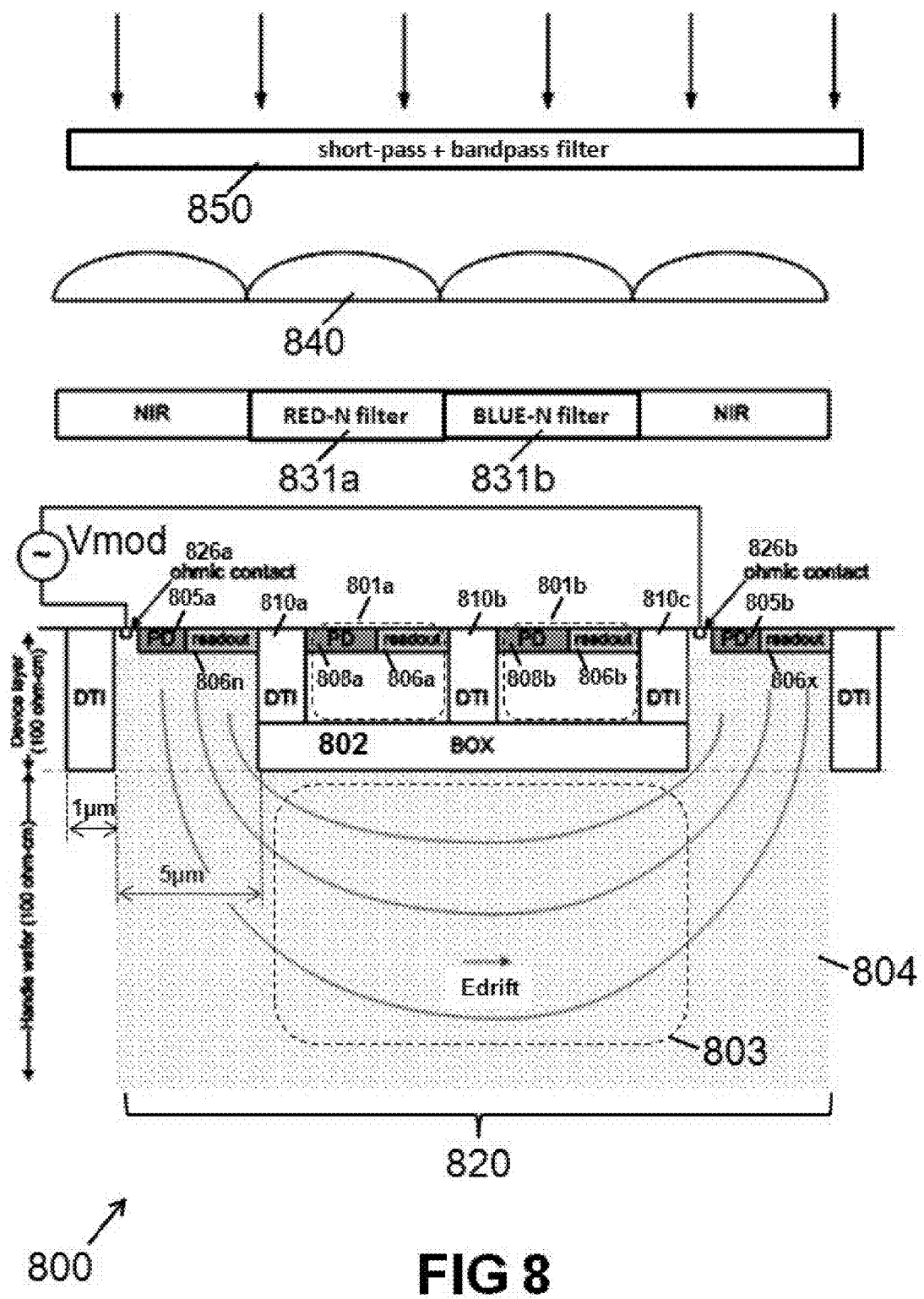
FIG. 8 shows a particular embodiment of a semiconductor pixel unit according to the present invention, further comprising micro-lenses and spectral filters.

FIG. 8 shows a particular embodiment of a semiconductor pixel unit 820 according to the present invention. In this embodiment, the first semiconductor region contains two image pixels 801a, 801b, each of which has its own readout circuit 806a, 806b. In the embodiment shown in FIG. 8, the image pixels 801a, 801b are electrically isolated from one another by means of a deep trench 801b, but the presence of this trench 801b is not mandatory, and even if present, need not extend to the buried oxide layer 102. The presence of the trenches 810a and 810c however is important to prevent photoelectrons generated in one region ending up in the other region. The NIR detector 805a has about the same size as those of the image detector 801, and it also has its own readout circuit 806n. Furthermore, there are two ohmic contact regions for applying a voltage for creating the lateral drift field in the second semiconductor region 804.

Figure 9A:
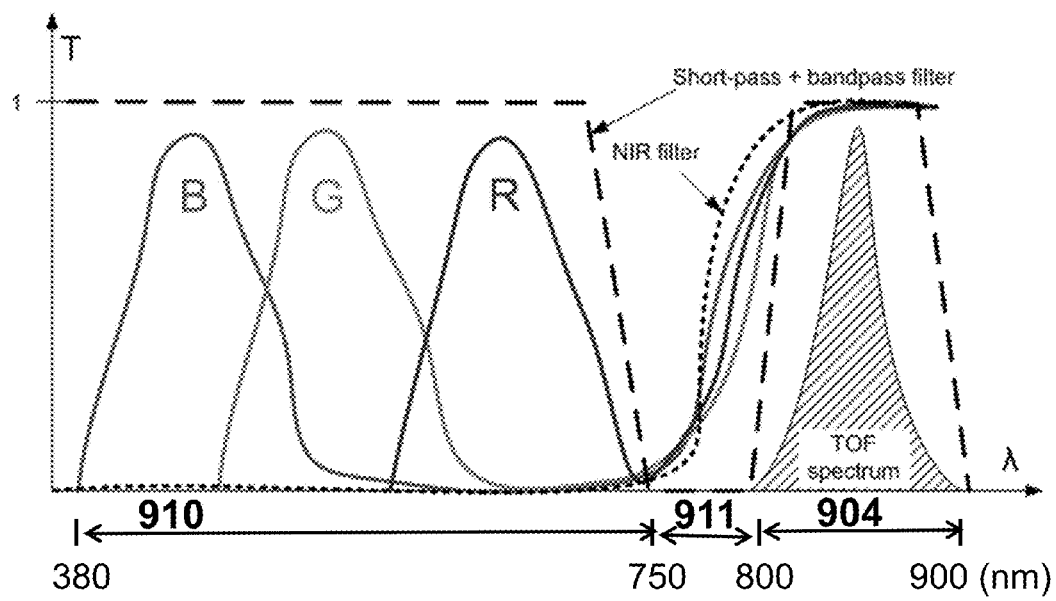
FIGS. 9(a)-9(e) show examples of suitable filters as may be used in the embodiment of FIG. 8.

This embodiment is also used to illustrate another aspect, which can also be used in any of the previously described embodiments. As shown, a first color filter 831a, with label RED-N, e.g. having an optical characteristic like the one shown in FIG. 9(e), is applied above or on top of a first image pixel 801a, which is therefore an image pixel adapted for capturing red light components, and is therefore called a "red color pixel". A second color filter 831b, with label BLUE-N, e.g. having an optical characteristic like the one shown in FIG. 9(c), is applied above or on top of a second image pixel 801b, which is therefore an image pixel adapted for capturing blue light components, and is therefore called a "blue color pixel".

Most of the Red incident light will pass through the RED-N filter 831a, and be absorbed in the first semiconductor region 801a. Most of the Green and Blue light will be blocked by the RED-N filter 831a. Most of the NIR light will pass through the RED-N filter 831a, and through the first semiconductor region 801a, and through the insulating layer 802, and be absorbed in the second semiconductor region 804, or part 803 thereof where the deep lateral drift field E is present.

The embodiment of FIG. 8 also has microlenses 840 arranged above each of the image detectors and above the NIR detector. Microlenses can also be added to the embodiments of FIG. 1 to FIG. 4, irrespective of the presence or absence of color filters 831. It is noted that the presence of microlenses is completely optional, but when present, it may help to improve the sensitivity of the visible and NIR pixels.

Finally, the embodiment of FIG. 8 also has a so called "short-pass and bandpass" filter 850, which will be described in relation to FIGS. 9(a)-9(e). Also this filter 850 is purely optional, and can be present in any of the embodiments shown in FIG. 1 to FIG. 4, irrespective of the presence or absence of the microlenses 840 and/or color filters 831.

FIGS. 9(a)-9(e) show a set of suitable filters as may optionally be added to semiconductor pixel units of the present invention, to further improve the performance or accuracy. The relevant part of the spectrum is the visible light spectrum and a part of the NIR spectrum, for example the part of the spectrum from 390 nm to about 900 nm, wherein it is assumed that the light by the light source for measuring TOF-information is a light source that creates a signal having a narrow spectrum centered around 850 nm, as shown for example in FIG. 9(a).

Figure 9B:
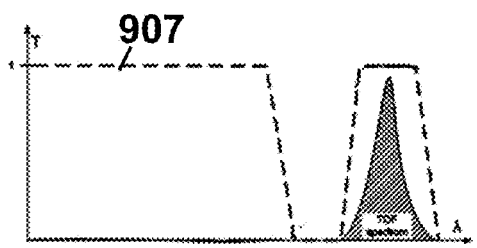
Figure 9C:
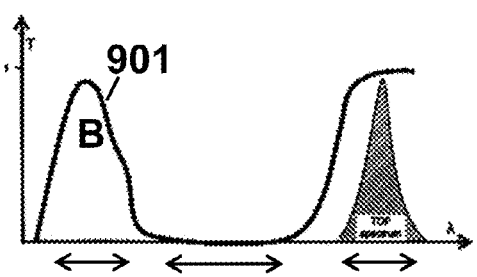

FIG. 9(b) shows an optical filter (herein referred to as "short pass+bandpass filter") (with a characteristic 907) for blocking light having wavelengths from about 750 nm to about 800 nm and wavelengths higher than about 900 nm, while passing light having wavelengths in the visible range from about 390 nm to about 750 nm and in a relatively narrow band in the NIR range, for example from about 800 nm to about 900 nm. Such a filter can be realized in known ways, e.g. an "interference filter" can be used to achieve the desired response. Such filters may be composed of several layers of materials with different refraction index. This filter technology allows an arbitrary transmission characteristic. This filter is advantageously located over or in front of the entire substrate area. Interference type filters are known in the art, for example as described in FR2904432, incorporated herein by reference.

FIG. 9(c) shows a blue color filter (with a characteristic 901) as can advantageously be used on top of some of the image pixels. This color filter allows passage of blue light, while blocking (or at least attenuating) green and red light, and allows passage of NIR light in the predefined range of about 800 to about 900 nm.

Figure 9D:
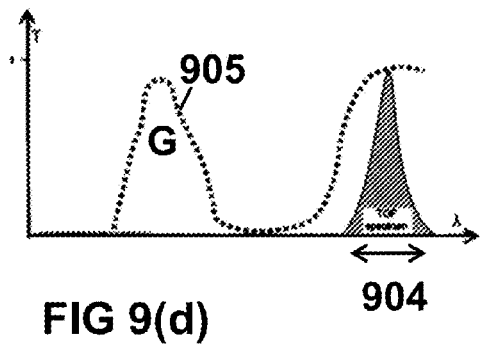
Figure 9E:
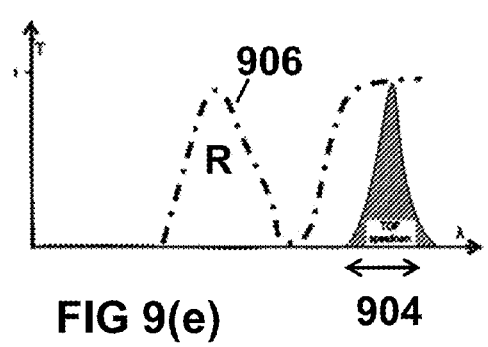

FIG. 9(d) shows a green color filter (with a characteristic 905) as can advantageously be used on top of some of the image pixels. This color filter allows passage of green light, while blocking (or at least attenuating) blue and red light, and allows passage of NIR light in the predefined range of about 800 to about 900 nm.

FIG. 9(e) shows a red color filter (with a characteristic 906) as can advantageously be used on top of some of the image pixels. This color filter allows passage of red light, while blocking (or at least attenuating) blue and green light, and allows passage of NIR light in the predefined range of about 800 to about 900 nm.

FIG. 9(a) shows all these curves in a single graph.

Color filters such as the ones shown in FIG. 9(c) to FIG. 9(e) can be used to pass only a single color component to a particular image pixel, so that it acts as a color pixel. This behavior is known from digital image cameras, except that for the present application, it is important that the filter allows passage of part of the NIR spectrum, e.g. from about 800 to about 900 nm. It is advantageous that the visible light filters (for example red, green or blue color filters) are at least partially, preferably as much as possible transparent for NIR wavelengths, so that almost the entire space of the pixel unit under the color detectors, or more accurately under the insulation layer 102, can be used for capturing NIR light. In practice of course, 100% passage and 100% blockage is not possible, but materials having an optical filter characteristic resembling the curves shown in FIG. 9(c) to FIG. 9(e) do exist, and are known in the art.

The behavior of the filter 850 having the characteristic 907 shown in FIG. 9(b) for wavelengths lower than 390 nm (i.e. UV light) is not important when this filter is used in combination with the color filters shown in FIG. 9(c) to FIG. 9(e), because the color filters block such wavelengths already. However, the filter 850 is preferably designed to block light having a wavelength above 900 nm, as much as possible.

As mentioned before, the presence of the microlenses 840, and/or the color filters 831, and/or the so called "short pass+bandpass filter" 850 is not essential for the present invention, but when present, the image sensor can capture color images, and the accuracy of the TOF-measurement can be increased. In preferred embodiments of the present invention, such microlenses 840 and color filters 831 and such "short pass+bandpass filter" 850 are present. Providing microlenses 840 is advantageous because it focuses incident light on the metallization-free photo sensitive silicon area. This further helps to reduce, e.g. minimize optical cross talk, which is beneficial for the image quality.

Figure 10:
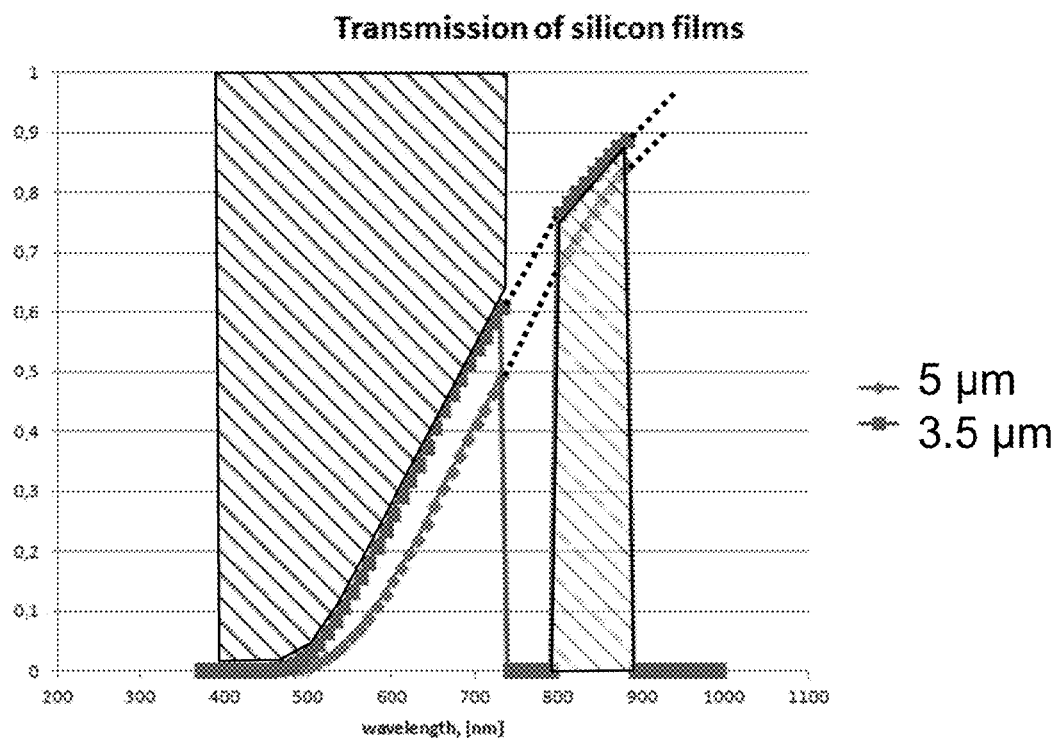
FIG. 10 shows (dotted line) the optical transmission characteristic of a silicon film having a thickness of 5 micron resp. of 3.5 micron for incident radiation having a wavelength in the range of about 400 to about 1000 nm.

FIG. 10 shows (in dotted line) the optical transmission characteristic of a silicon film having a thickness of 5.0 micron resp. of 3.5 micron for incident radiation having a wavelength in the range of about 400 to about 1000 nm. The shown dip from about 750 nm to about 800 nm is due to the filter shown in FIG. 9(b), when present. The purpose of this graph is to show that a major portion (the hashed area above the transmission curve from 400 to 750 nm) of the visible light is blocked by the first (upper) semiconductor layer before reaching the second semiconductor region. Also a small portion of the NIR light will be blocked (the area above the transmission curve from 800 to 900 nm), but a major portion (the hashed area below said curve) is passed to the second semiconductor layer. Thus the NIR part has very small attenuation when passing through the first (upper) semiconductor region, while the visual light is mostly absorbed (especially blue and green light) before reaching the second (lower) semiconductor region.

If other semiconductor material were used, e.g. Germanium, or a Si-compound or a Ge-compound, then of course a slightly different characteristic would be obtained, but the same principles would still apply: the first semiconductor region absorbs most of the visible light while passing NIR light. The skilled person can choose a suitable thickness of the first and second semiconductor layer depending on the optical characteristics, in particular the absorption characteristic of visible light of the material being used.

Figure 11:
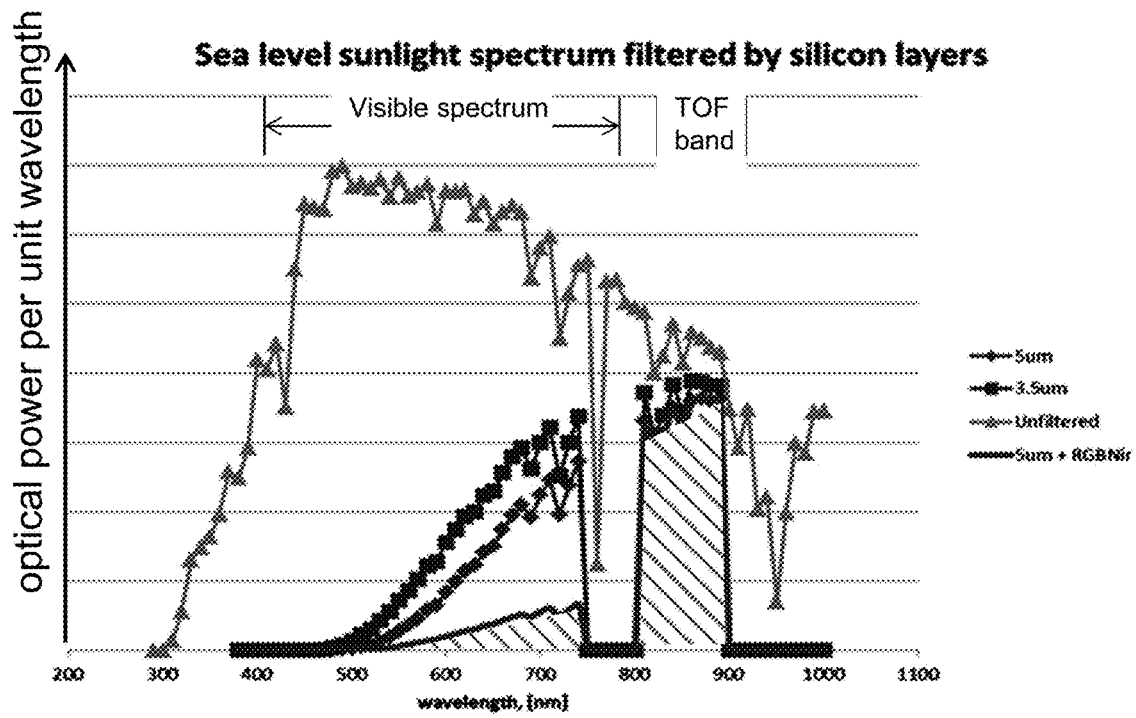
FIG. 11 shows the spectrum of FIG. 5 in combination with the "short pass and bandpass" filter of FIG. 9(a).

FIG. 11 shows the typical sunlight spectrum of FIG. 5 in combination with the "short-pass+bandpass" filter of FIG. 9(b), if present. It shows the power spectrum of the radiation reaching the second (lower) semiconductor region, as the hashed areas.

The purpose of the filters (if present) is to avoid or at least reduce the pollution of the TOF NIR signal by the sunlight shot noise. The sunlight reaching the bottom layer can thus be filtered by several stages: (1) by the "short-pass+bandpass" filter as shown e.g. in FIG. 9(b): it rejects everything except the visible light and a narrow TOF band, (2) by the color filters as shown e.g. in FIG. 9(c) to FIG. 9(e): they pass the color+NIR, (3) by the top silicon layer as shown e.g. in FIG. 10 (dotted curve, without the dip from 750 to 800 nm). Performance:

The above part of the description describes mainly the three-dimensional structure and the effect of the lateral electrical field. It was found, however, that the performance of the device, in particular the speed of the NIR light detection and demodulation, may be negatively influenced by the presence of positive charge inside the insulation layer, e.g. positive charge trapped in the oxide, or near the oxide/silicon interface.

It seems to be inevitable in semiconductor processing that at least some amount of positive charge ends up in silicon-oxide. While this does not cause a performance problem (or limitation) for devices such as for example MOSFETs, because such devices typically use heavily doped silicon (e.g. about $10^{17}/cm^3$), if no measure is taken, it typically will cause create a performance problem (or limitation) for devices according to the present invention, using intrinsic or lowly doped (e.g. about $10^{12}/cm^3$) semiconductor materials, which is e.g. 5 orders of magnitude lower. This phenomenon will typically occur in all the devices shown in FIG. 1 to FIG. 8, but once realized and understood, can be solved as will be described next, with reference to FIG. 12 to FIG. 16.

Figure 12:
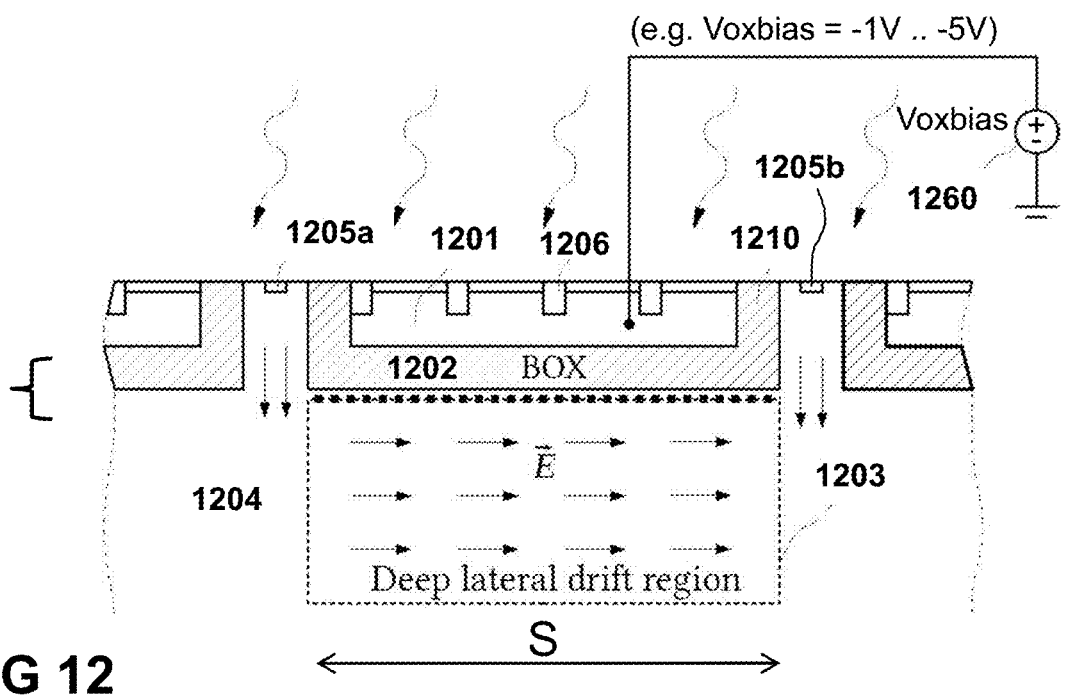
FIG. 12 shows a manner of pushing photoelectrons generated in the second semiconductor away from the silicon-oxide interface, by using the first semiconductor region as a bias electrode, and by negatively biasing the first semiconductor region with respect to the second semiconductor region.

FIG. 12 shows the structure of FIG. 1, further provided with means for applying a DC bias voltage referred to as 'Voxbias' between the first semiconductor region 1201 and the second semiconductor region 1204, as an example. This may be implemented in practice by connecting the second semiconductor region to ground, and by connecting the first semiconductor region to a voltage source relative to ground (as is shown in FIG. 12). This DC bias voltage 'Voxbias' can also be applied to any of the structures of FIG. 2 to FIG. 8, and can be chosen independently for example from the bias voltage 'Vbias' of FIG. 3 (which creates the lateral electrical field), and from the voltage Vmod of FIG. 4 (which creates the lateral electrical field).

Figure 13A:
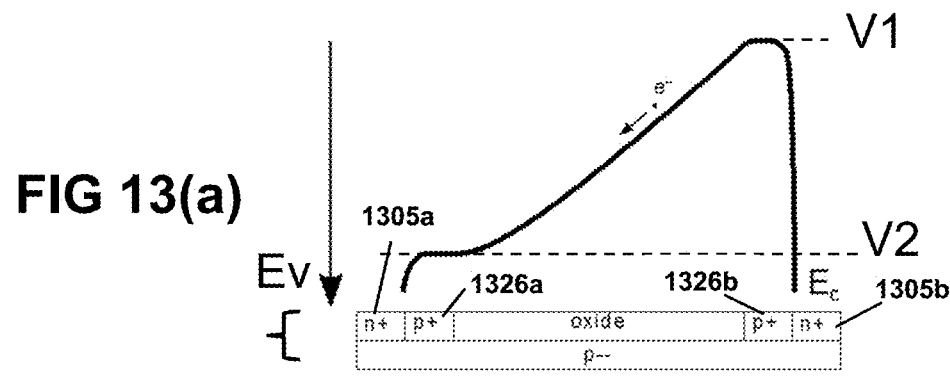
FIG. 13(a) shows a conduction band diagram for an electrically neutral oxide, located between two highly doped p+ regions, which in turn are located between two highly doped n+ regions, when a voltage is applied over said p+ regions.

FIG. 13(a) shows a conduction band diagram for an electrically neutral oxide for the structure of FIG. 4 at different positions on the thick black dotted line of FIG. 12, directly below the oxide, at a particular moment in time, at which a voltage V1 is applied to the p+ region shown on the right of FIG. 13(a) and a voltage V2 higher than V1 is applied to the p+ region shown on the left of FIG. 13(a). The p+ region may for example have a doping level in the range of $10^{15}$ to $10^{19}/cm^3$, for example about $10^{16}/cm^3$, for example about $10^{17}/cm^3$, for example about $10^{18}/cm^3$.

Figure 13B:
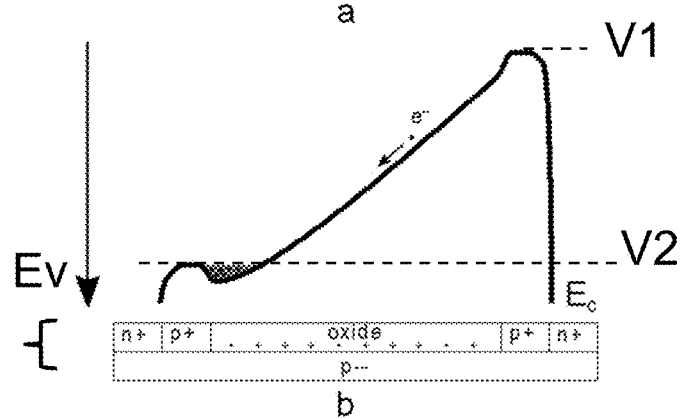
FIG. 13(b) shows a conduction band diagram of the structure of FIG. 13(a), for a positively charged oxide (e.g. an oxide comprising positive charge carriers trapped therein).

FIG. 13(b) shows a conduction band diagram for the same locations, in case a positive charge is trapped inside the oxide. This positive charge will attract photoelectrons generated in the second semiconductor region to move upwards towards the oxide-interface.

The speed performance of the demodulating sensor depends on the drift electrical field strength and electrostatic potential monotonicity from the point where the photocharge is generated (e.g. somewhere inside the deep lateral drift region) to the point where it is detected in the detection region (e.g. one of the n+ regions at the surface). If at some point in the region 104 the electrostatic potential is not monotonous, a charge trap forms, which can significantly degrade the demodulating speed of the device.

The oxide contains positive interface charge and typically there is an additional positive charge trapped in the oxide itself from the process of oxide growth. The structure depicted in FIG. 13(a) is a simplified version of an "RGBZ pixel", in particular a small "slice" thereof just above and just below the interface between the oxide and the second semiconductor region (indicated by the bracket in FIG. 12). A demodulating drift field is created by applying an alternating voltage V1(t) and V2(t) to the p+ regions 1205a and 1205b. The energy band diagram is sampled along a horizontal line located beneath the oxide along the oxide—semiconductor interface (the thick dotted line of FIG. 12). The positive charge present in the oxide shifts the energy band in the underlying semiconductor along the oxide-semiconductor interface causing a formation of a "charge trap" which deteriorates the speed of the sensor. For example, at least some of the photoelectrons which are supposed to be detected by the left n+ detection region 1305a get trapped in the charge pocket, which needs to be filled before they or further photoelectrons can continue to flow on to the n+ detection region 1305a. The trapped photoelectrons leave the charge trap slowly by diffusion. The trapped photoelectrons can even be detected by the wrong detection node if they remain trapped at the time when the demodulating electrical field direction is reversed. These effects may have a significant impact on the speed performance and on the device linearity.

Figure 14:
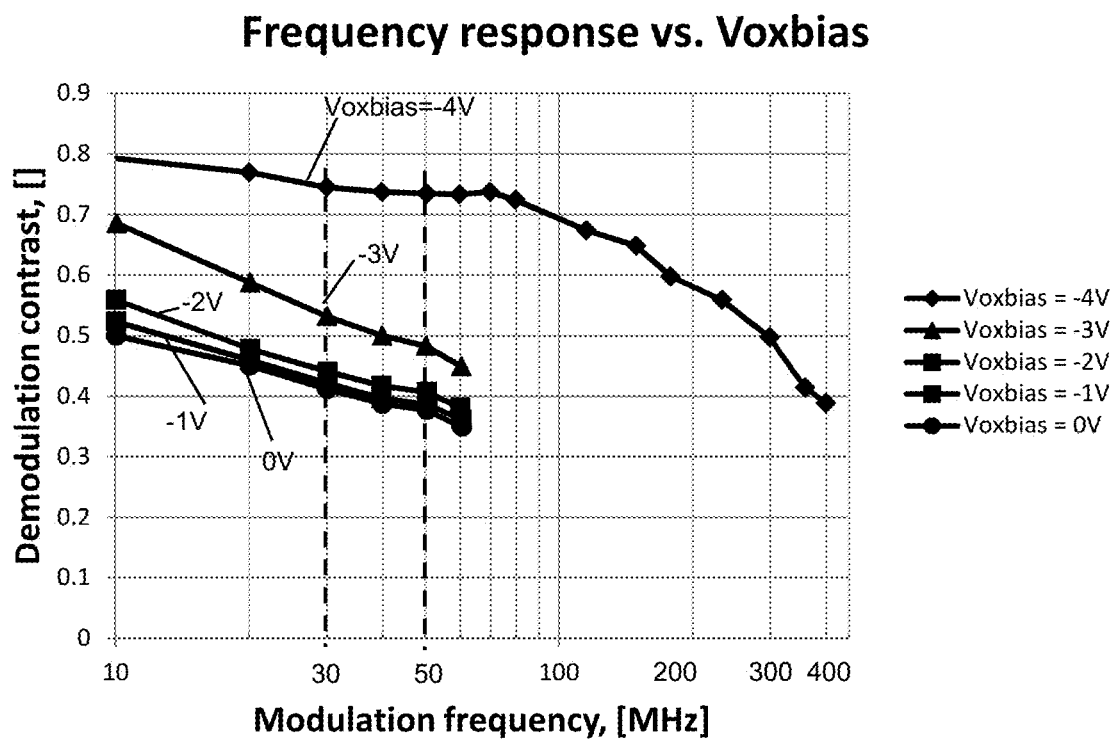
FIG. 14 shows data of an experimental performance measurement on a first experimental device having a structure similar to the structure shown in FIG. 4, and having a bias voltage applied over the oxide as shown in FIG. 12, showing "demodulation contrast" versus "modulation frequency", for bias voltages applied over the oxide ranging from 0V to −4V, and for a modulation frequency in the range of 10 MHz to about 400 MHz.

The impact of the bias voltage 'Voxbias' applied between the first and second semiconductor region and thus over the oxide (in case the insulation region is an oxide) on the speed of the device can for example be seen from the experimental measurement plot of "demodulation contrast" versus "modulation frequency" of FIG. 14.

This measurement was taken on an experimental test structure very similar to the structure shown in FIG. 12, having a size "S" of about 7 micron, where the first semiconductor region was made of poly-silicon, and was used as an electrode on top of the oxide region. The poly-silicon electrode is at least transparent in the NIR wavelength range. As can be seen, the "demodulation contrast" (speed) in the typical operating frequency range, e.g. the range from 30 to 50 MHz, is rather low (e.g. lower than 0.4) for Voxbias equal to −2V and 0V respectively. However, for more negative Voxbias voltage, in this structure for example for −4V, the demodulation contrast is acceptably high (e.g. higher than 0.6) for frequencies up to about 150 MHz.

Figure 15:
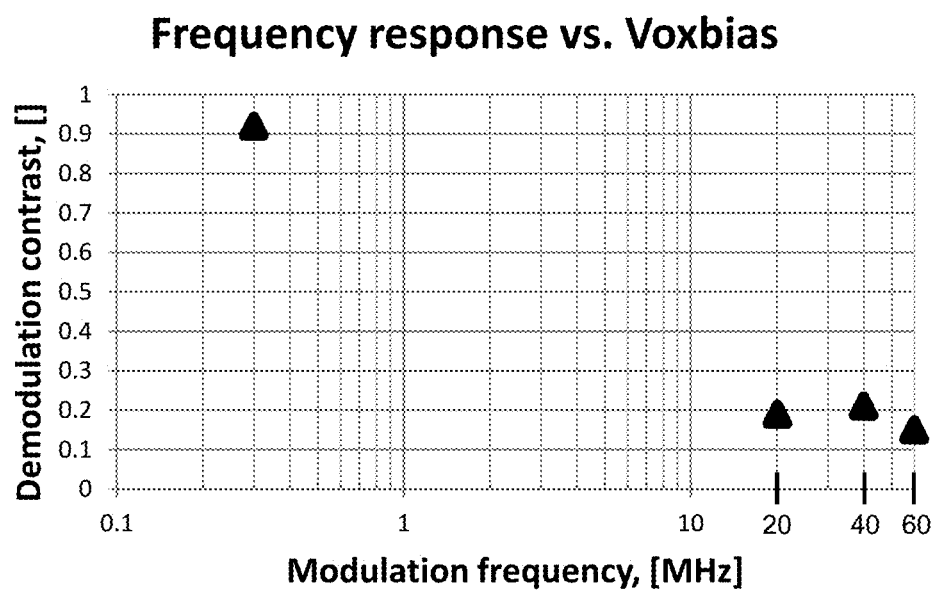
FIG. 15 shows data of an experimental performance measurement on a second experimental device having a structure similar to the structure shown in FIG. 4 (but without the first semiconductor region on top and hence no bias voltage applied over the oxide), showing "demodulation contrast" versus "modulation frequency", and for a modulation frequency in the range of 300 kHz to 60 MHz.

FIG. 15 shows a plot similar to FIG. 14 but for another device produced without a "transparent electrode" on top of the oxide, (i.e. without the first semiconductor region, meaning that there was only an oxide on top of the second semiconductor region), and having a size S (see FIG. 12) of about 14 micron. The electric drift field was created under the oxide by means of two ohmic contacts with a modulated voltage source connected between them. In this example, the demodulation contrast was equal to about 20% for modulation frequencies in the range of 20 to 50 MHz. No bias voltage was applied over the oxide.

Referring back to FIG. 14, it was found that the optimal (e.g. in terms of maximum speed) Voxbias voltage is slightly more negative than the voltage required to achieve a flat band condition (e.g. about 100 mV more negative). Using such bias voltage, the photoelectrons generated by NIR light in the second semiconductor region are pushed away from the oxide surface, so that the probability of recombination or trapping is reduced. If the Voxbias voltage is too negative, an accumulation layer in the semiconductor can occur, leading to a much increased current consumption, thus power consumption. For any given structure and for a given modulation frequency (of the light source), the skilled person can find a suitable Voxbias voltage by experimentation (if the structure is adapted for applying such a voltage, of course).

In one embodiment, the applied Voxbias voltage is a constant predefined DC voltage. This can for example be used if the amount of positive charge trapped in the oxide can be controlled within predefined margins (during production).

In another embodiment, a control loop (e.g. regulating the current consumption through the bias electrodes 426 by setting the Voxbias voltage) may be established to achieve the optimal voltage for Voxbias which will maximize the speed of the device while preventing the excessive power consumption due to the formation of the accumulation layer.

In yet another embodiment, the optimal bias voltage Voxbias is determined by means of a calibration step.

Quite surprisingly, the biasing voltage Voxbias allows the modulation frequency to be increased much higher than the typical 30 to 50 MHz frequency, while still providing a demodulation contrast of at least 45%. The maximum obtainable value depends on mainly 3 parameters:

(1) the smaller the dimensions of the device, the shorter the distance the NIR photoelectrons need to travel, the faster the device,
(2) the larger the magnitude of the modulating signal, e.g. the amplitude of the modulating voltage signal, the higher the lateral electrical drift field, the faster the device, and
(3) the bias voltage Voxbias applied over the oxide.

In particular embodiments of the present invention, the dimensions of the device (in particular the size S of FIG. 12) and the bias voltage Voxbias, and the amplitude of the modulation signal are chosen such that, e.g. at room temperature:

a) the demodulation contrast is at least 65% and the modulation frequency is at least 100 MHz, or
b) the demodulation contrast is at least 60% and the modulation frequency is at least 100 MHz, or
c) the demodulation contrast is at least 55% and the modulation frequency is at least 100 MHz, or
d) the demodulation contrast is at least 50% and the modulation frequency is at least 100 MHz, or
e) the demodulation contrast is at least 50% and the modulation frequency is at least 200 MHz, or
f) the demodulation contrast is at least 40% and the modulation frequency is at least 300 MHz.

Similar considerations also apply to p-i-n detectors formed in the region 104, as shown in the structure of FIG. 3. Also here, a bias voltage Voxbias can be applied between the first semiconductor region 301 and the second semiconductor region 304 to create a vertical electrical field component over the horizontal part of the buried-oxide layer BOX 302.

Figure 16:
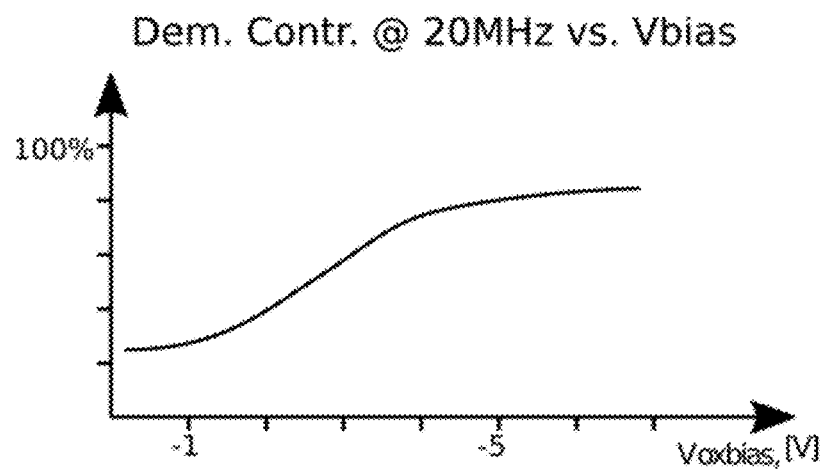
FIG. 16 is a qualitative graph for indicating a typical improvement of "demodulation contrast" of a pixel according to the present invention, by applying a bias voltage between the first and second semiconductor region. (the values on either axis being exemplary values).

FIG. 16 illustrates a typical qualitative improvement when applying the bias voltage Voxbias between the first and second semiconductor region. The plot shows "demodulation contrast" versus the bias voltage 'Voxbias' for a given modulation frequency (for example about 20 MHz). Although the absolute values depend on the particular structure (dimensions and materials) being used, it can roughly be stated that for relatively low modulation frequencies (e.g. in the range of 20 to 50 MHz) the demodulation contrast can typically be increased from below 40% (when no bias voltage Voxbias is applied) to at least 60%, by applying a suitable bias voltage Voxbias. And that for relatively high modulation frequencies (e.g. higher than 100 MHz or even higher than 200 MHz), the demodulation contrast can typically be increased from below 20% (when no bias voltage Voxbias is applied) to at least 50%, by applying a suitable bias voltage Voxbias.

Figure 17:
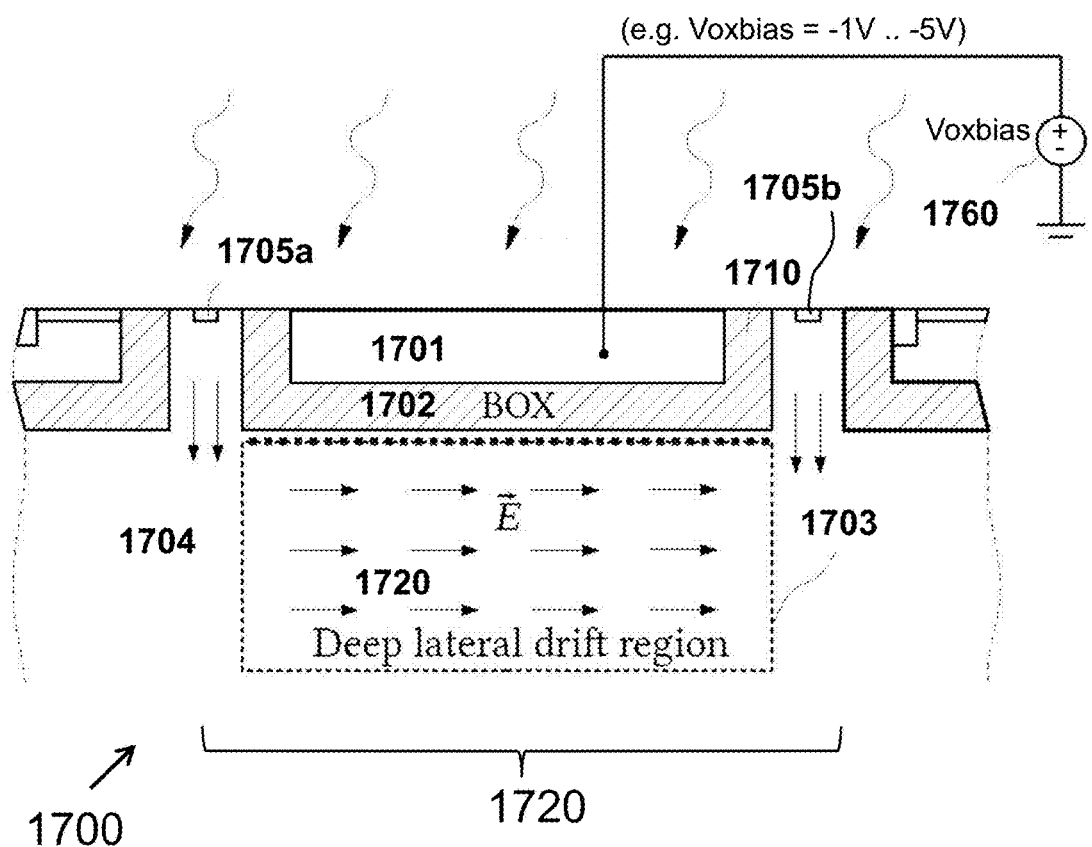
FIG. 17 is a variant of FIG. 12 for illustrating embodiments of the present invention not having pixels for sensing visible light.

In FIG. 12 a semiconductor structure was described, wherein the first semiconductor region has detection regions and readout circuitry for detecting visible light information. In FIG. 17 a variant of this pixel unit is shown, not having such detection regions and readout circuitry for detecting visible light information, but only detection regions 1705 for detection of NIR light. Apart from this difference, most of what has been described above, for the embodiments of FIG. 1 to FIG. 12 is also applicable for the embodiment of FIG. 17. Stated differently, if the circuitry for detecting and/or reading out visible light information is omitted from the embodiments shown in FIG. 1 to FIG. 11, one would obtain variants of FIG. 17. Everything described above in relation to NIR detection in the embodiments of FIG. 1 to FIG. 16 is also valid for these variants of FIG. 17, except of course that no visible light is being captured. In these embodiments, the color filters of FIG. 8 may be omitted, and the filter characteristics of the so called "short pass+bandpass filter" 850, in particular in the visible spectrum range from 390 to 750 nm is less relevant. In fact, in these embodiments (not having visible light detectors) a bandpass filter adapted to pass light only in the range from about 800 nm to about 900 nm could also be used, and may actually provide even better results.

It is explicitly pointed out that not all claimed embodiments of the present invention are explicitly shown in the figures, since most drawings are intended to illustrate only particular features. Other embodiments of the invention are recited by the claims, and their dependencies.

For example, all embodiments of the present invention have in common: a single substrate with a first and second semiconductor region electrically separated by an insulating region (preferably an oxide), and means for generating a lateral electrical field below the first semiconductor region.

But the following features can for example vary amongst the different embodiments:
means for generating lateral electrical field: (a) non-constant doping profile (as illustrated in FIG. 2), (b) intrinsic doping profile and PIN-structure (as illustrated in FIG. 3), (c) lowly doped profile and p-plus regions and n-plus regions (as illustrated in FIG. 4),
first semiconductor region with/without detection regions and/or readout circuitry for capturing and/or readout of visible light information,
insulating layer: (a) buried oxide with optional trenches, (b) SOT, (c) nitride layer,
insulating layer shape: e.g. bathtub, flat or planar;
first semiconductor region material: e.g. monocrystalline silicon or polysilicon;
first semiconductor region is e.g. continuous or segmented, placed only over the critical areas, where the charge traps can form;
first semiconductor region negatively biased w.r.t. second semiconductor region: (a) yes, (b) no,
any of microlenses, color filter, shortpass+bandpass filter or other filter present: (a) yes, (b) no.

The invention claimed is:
1. A semiconductor pixel unit comprising:
a single semiconductor substrate comprising a first semiconductor region and a second semiconductor region, the second semiconductor region being entirely electrically separated from the first semiconductor region by means of an insulating region, the first semiconductor region being configured to detect visible light; and
a doping profile configured to generate a lateral electrical field in a region underneath the first semiconductor region, the electrical field being adapted for promoting transport of photoelectrons in the second semiconductor region generated by the near-infrared light after passing through the first semiconductor region and through the insulating region;
the second semiconductor region comprising at least one near-infrared light detector located at the surface of the semiconductor substrate for detecting the photoelectrons generated in the second semiconductor region by the near-infrared light,
wherein the insulating region between the first semiconductor region and the second semiconductor region comprises a buried oxide layer.
2. The semiconductor pixel unit according to claim 1, further comprising a voltage source configured for negatively biasing the first semiconductor region with respect to the second semiconductor region to affect the energy bands near the surface of the second semiconductor region over at least a portion of the insulation region so that the photoelectrons generated in the second semiconductor region by the near-infrared light are pushed away from the insulating region.
3. The semiconductor pixel unit according to claim 1, wherein the insulating region between the first semiconductor region and the second semiconductor region further comprises at least one insulating trench, preferably extending from the semiconductor surface to the insulating layer.
4. The semiconductor pixel unit according to claim 1, wherein
either the second semiconductor region has a non-constant doping profile as the doping profile configured to generate said lateral electrical field,
or the second semiconductor region has an intrinsic doping level, and wherein the semiconductor pixel unit has a first detector element being an n-doped region and a second detector element being a p-doped region, so as to form a P-I-N structure as the doping profile.
5. The semiconductor pixel unit according to claim 1, the semiconductor pixel unit comprising the doping profile, wherein the second semiconductor region is a lowly p-doped region, and wherein the semiconductor pixel unit has a first n-doped detector element and a second n-doped detector element, and further comprising a first p-doped contact region arranged in the second semiconductor region adjacent the first detector element, and a second p-doped contact region arranged in the second semiconductor region adjacent the second detector element, the first and the second contact regions allowing a voltage to be applied for creating said lateral electrical field.

6. The semiconductor pixel unit according to claim 1, further comprising at least one readout circuit for reading out data of the near infrared light detector.

7. The semiconductor pixel unit according to claim 1, further comprising a demodulator having a first input connected to the NIR detector and a second input for receiving a modulation waveform from a modulator, and having an output for providing a demodulated NIR signal to a distance determination circuit.

8. The semiconductor pixel unit according to claim 7, wherein said demodulator is adapted for operating at a demodulation frequency of at least 10 MHz, and wherein said semiconductor pixel unit further comprises a predefined DC voltage source for providing a bias voltage, the bias voltage being chosen such that the demodulation contrast of the pixel unit is at least 50%.

9. A semiconductor sensor comprising:
a sensor array comprising a plurality of semiconductor pixel units according to claim 1;
a distance determination circuit for deriving distance information based on the emitted near-infrared light and the measured reflected near-infrared light.

10. The semiconductor sensor according to claim 9, further comprising:
the modulator adapted for operating at a predefined frequency of at least 10 MHz, and
a demodulator, and
a predefined DC voltage source for providing a bias voltage between the first and second semiconductor region, the bias voltage preferably being chosen such that the demodulation contrast of the pixel unit is at least 50%.

11. A digital camera comprising the semiconductor sensor of claim 9, and further comprising:
a light source for emitting a modulated or pulsed near-infrared light to be reflected against objects in a scene to be captured;
circuitry for transmitting modulated infrared or near-infrared light, and circuitry for demodulating the received near-infrared light and for converting it into distance information.

12. A semiconductor pixel unit adapted for sensing near-infrared light and visible light, the semiconductor pixel unit comprising:
a single semiconductor substrate comprising a first semiconductor region and a second semiconductor region, the second semiconductor region being entirely electrically separated from the first semiconductor region by means of an insulating region; the first semiconductor region comprising at least one visible light detector for detecting photoelectrons generated in the first semiconductor region by the visible light,
a doping profile configured to generate a lateral electrical field in a region underneath the first semiconductor region, the electrical field being adapted for promoting transport of photoelectrons generated in the second semiconductor region by the near-infrared light after passing through the first semiconductor region and through the insulating region,
the second semiconductor region comprising at least one near infrared light detector located at the surface of the semiconductor substrate for detecting the photoelectrons generated in the second semiconductor region by the near infrared light,
wherein the insulating region between the first semiconductor region and the second semiconductor region comprises a buried oxide layer.

13. The semiconductor pixel unit according to claim 12, further comprising a voltage source configured for negatively biasing the first semiconductor region with respect to the second semiconductor region to affect the energy bands near the surface of the second semiconductor region over at least a portion of the insulation region so that the photoelectrons generated in the second semiconductor region by the near-infrared light are pushed away from the insulating region.

14. A semiconductor pixel unit comprising:
a single semiconductor substrate comprising a first semiconductor region and a second semiconductor region entirely electrically separated from the first semiconductor region by means of an insulating region;
a doping profile configured to generate a lateral electrical field in a region underneath the first semiconductor region, the electrical field being adapted for promoting transport of photoelectrons in the second semiconductor region generated by the near-infrared light after passing through the first semiconductor region and through the insulating region;
the second semiconductor region comprising at least one near infrared light detector located at the surface of the semiconductor substrate for detecting the photoelectrons generated in the second semiconductor region by the near infrared light,
wherein the semiconductor pixel unit further comprises at least one microlens arranged on top of said at least one visible light detector,
and/or further comprising at least one color filter arranged on top of said at least one visible light detector, the color filter having a characteristic for passing visible light in a first predefined band of spectrum, and for blocking or at least attenuating visible light in a second predefined band of the spectrum, and for passing a predefined band of near infrared light,
and/or further comprising an optical filter having a characteristic for passing visible light in a first band, and for blocking or at least attenuating light in a second band from about 750 nm to a predefined first frequency and for passing near-infrared light in a third band from the predefined first frequency to a predefined second frequency, whereby the predefined first frequency is a value in the range of 750 nm to a wavelength below the maximum wavelength of semiconductor sensitivity and the predefined second frequency is a value in the range from the predefined first frequency to the maximum wavelength of semiconductor sensitivity.

* * * * *